US005566295A

United States Patent [19]
Cypher et al.

[11] Patent Number: 5,566,295
[45] Date of Patent: Oct. 15, 1996

[54] EXTENSIBLE SIMULATION SYSTEM AND GRAPHICAL PROGRAMMING METHOD

[75] Inventors: Allen Cypher, Palo Alto; David C. Smith, Saratoga; James C. Spohrer, Santa Clara, all of Calif.

[73] Assignee: Apple Computer, Inc., Cupertino, Calif.

[21] Appl. No.: 187,682

[22] Filed: Jan. 25, 1994

[51] Int. Cl.$^6$ ........................................ G06F 3/00
[52] U.S. Cl. ................... 395/161; 395/155; 395/157; 364/578
[58] Field of Search .................. 395/155, 161, 395/159, 152, 157, 160; 364/578

[56] References Cited

U.S. PATENT DOCUMENTS

| | | | |
|---|---|---|---|
| 4,845,665 | 7/1989 | Heath et al. | 395/157 |
| 5,133,045 | 7/1992 | Gaither et al. | 395/51 |
| 5,247,651 | 9/1993 | Clarisse | 395/500 |
| 5,388,993 | 2/1995 | McKiel et al. | 434/118 |
| 5,428,740 | 6/1995 | Wood et al. | 395/161 |

OTHER PUBLICATIONS

Alex Repenning and Tamara Sumner, "Using Agentsheets To Create A Voice Dialog Design Environment," *Proceedings of the 1992 ACM/SIGAPP Symposium on Applied Computing*, Mar. 1992, pp. 1199–1207.
George W. Furnas, "New Graphical Reasoning Models For Understanding Graphical Interfaces," *Proceedings of CHI '91*, 1991, pp. 71–78.
Cypher, A., Ed., "Characterizing PBD Systems," *Watch What I Do: Programming By Demonstration*, pp. 467–484.
Cypher, A., Ed., "Demonstrational Interfaces: A Step Beyond Direct Manipulation," *Watch What I Do: Programming By Demonstration*, pp. 485–512.

*Primary Examiner*—Raymond J. Bayerl
*Assistant Examiner*—Crescelle N. dela Torre
*Attorney, Agent, or Firm*—Carr, DeFilippo & Ferrell LLP

[57] ABSTRACT

An extensible simulation system and graphical programming method enable a simulation user to program the behaviors of objects in a simulation while requiring no knowledge of computer programming concepts or languages. The simulation user defines each object's behaviors by creating Graphical Rewrite Rules through programming by demonstration. The user can selectively abstract a given Graphical Rewrite Rule (GRR) such that it applies to states within the simulation according to hierarchical object types and object property conditions. The extensible simulation system comprises a Central Processing Unit (CPU), an input device, an output device, an external storage device, predetermined amounts of Random Access Memory (RAM) and Read-Only Memory (ROM), and an extensible simulator. The extensible simulator comprises an object source, a simulation viewer, a GRR editor, an action recorder, an abstractor, a drawing editor, an object property editor, an object rule viewer, a subroutine editor, and a simulation execution controller. Each element of the system has an input and an output coupled to a common system bus. Preferably, each element of the extensible simulator is a computer program step sequence stored in RAM. The graphical programming method comprises the steps of: selecting an object for which a GRR is to be defined; establishing a simulation context corresponding to the GRR; defining for the GRR a set of actions to be performed by or upon one or more objects within the simulation context, each action defined through programming by demonstration; automatically recording a computer program step sequence for each action defined; and allowing the GRR to be abstracted.

44 Claims, 26 Drawing Sheets

EXTENSIBLE SIMULATION SYSTEM AND GRAPHICAL PROGRAMMING METHOD

BACKGROUND OF THE INVENTION

1. Field of the Invention

The present invention relates generally to computer program generation, and more particularly, to systems and methods for user-programmable computing applications. Still more particularly, the present invention is an extensible simulation system and method wherein specialized knowledge about computer systems, languages, or programming is not required for modifying simulation functionality.

2. Description of the Background Art

Computer simulations are a powerful educational tool. In a computer simulation, groups of objects having predefined properties or characteristics typically interact according to corresponding object behavior rules that have been programmed by the creators of the simulation. Interactions between objects generate one or more corresponding predefined results or consequences according to the hard-programmed behavior rules. A user can selectively place objects in a simulation and observe their resulting interactions on a display. The results generated by a given interaction can initiate further interactions between objects, resulting in a chain of events. Computer simulations thus allow complex situations to be created and modeled.

An example of a popular computer simulation is SimCity, in which a user is responsible for the construction, maintenance, and expansion of a computer-generated city. Objects used in SimCity include roads, railroads, police stations, hospitals, and various types of buildings. Object interactions produce results such as growth, revenue, crime, traffic congestion, and pollution.

Most computer simulations are inflexible in that they do not allow the predefined object characteristics and behavior rules to be modified. As a result, the simulation is predictable and inflexible, thereby limiting its capabilities as an educational tool. For example, currently in SimCity the addition of a railroad at a given location results in the elimination of pollution problems in the vicinity of the railroad. While the addition of a railroad might aid in the reduction of pollution problems, particularly if it were used for public transportation purposes, the complete elimination of pollution problems in this example is an unrealistic scenario.

Computer simulation designers have realized that simulations are much more useful and versatile if the user is allowed to modify object properties and behavior rules. Modification of object properties and behavior rules to any significant degree, however, involves computer programming. The typical computer simulation user does not possess the specialized skills and knowledge required for computer programming. In particular, knowledge of computer program constructs and syntax are learning barriers that are difficult for children and non-technical people to overcome. Therefore, computer simulation designers have attempted to provide simulation users with a simplified means for programming the simulation.

Simplified "English-like" programming languages are one approach taken to simplify simulation programming for users. One example of this approach is the HyperTalk programming language. While such a programming language that resembles a user's native language can be easier for the user to learn, writing programs is still an abstract process. There is a conceptual gulf between what the user wants to happen in the simulation, and what he or she has to write even in these "English-like" programming languages. For example, to move an object on the simulation display, in HyperTalk the user must deal with x and y coordinates. As a result, this approach towards simplifying simulation programming has been unsuccessful.

Another approach taken to simplify simulation programming for simulation users is programming by demonstration. In programming by demonstration, a user directly manipulates objects to indicate a sequence of actions to be performed. A sequence of computer program steps that will perform each required action in the sequence is then automatically generated. While this simplifies the creation of the computer program steps for the user, a listing of such computer program steps requires specialized knowledge to understand. Because the typical simulation user does not possess such knowledge, the simulation user does not understand the relationships between demonstrated object actions, and their corresponding computer program steps. Prior art programming by demonstration systems and methods are therefore ineffective for teaching the typical simulation user about computer programming concepts.

A common construct encountered in computer programming is the conditional statement. A conditional statement specifies that if a predetermined condition holds true, then a corresponding sequence of computer program steps are to be executed. One form of the conditional statement is a Before-After rule. A Before-After rule deals with simulation states. Each Before-After rule has two parts: a "before" part and an "after" part. Each part represents a possible state of the simulation. Whenever the "before" part matches the current state of the simulation, the simulation is transformed into the state specified by the "after" part. Before-After rules are widely used in the branch of Artificial Intelligence known as "expert systems." A graphical Before-After rule is referred to herein as a Graphical Rewrite Rule (GRR). In the execution of prior art Graphical Rewrite Rules, when a graphical condition or picture matches the "before" portion of the GRR on a pixel-by-pixel basis, a sequence of computer program steps is executed that produces the graphical condition indicated by the "after" portion of the GRR.

Graphical Rewrite Rules have been applied in the prior art for simplifying computer simulation programming for users. The "before" portion of a GRR is a set of picture elements (pixels) that represent a possible graphical state or picture that can occur during a simulation's execution. The "after" portion of a GRR is a set of pixels that indicate how the picture in the simulation is to appear following an occurrence of the GRR's "before" portion in the simulation. If, during the execution of the simulation, a picture within the simulation matches a given GRR "before" portion on a pixel-by-pixel basis, a sequence of computer program steps corresponding to the GRR is executed. Execution of the sequence of computer program steps transforms the picture in the simulation that originally matched the pixels of the GRR's "before" portion into a picture that matches the pixels of the GRR's "after" portion.

For each simulation object, the simulation user creates a GRR for each possible simulation state of interest. Even in relatively simple simulations, each simulation object can participate in a large number of distinct simulation states. Therefore, an undesirably large number of GRR definitions must be made for each object. This drawback has limited the use of Graphical Rewrite Rules as a means for simplifying simulation programming.

In the definition of a GRR, the user graphically specifies the corresponding "before" and "after" portions of the GRR.

The sequence of computer program steps that results in the graphical transformation of the "before" portion into the "after" portion is generated automatically, thereby greatly simplifying simulation programming for the user. Some systems and methods have tried to have the computer infer how to arrive at the after state from the before state. However, this is currently an unsolved problem in computer science, and such systems and methods have not succeeded.

During the execution of a simulation, one or more characteristics or properties of an object may change according to one or more applicable rules. The set of properties corresponding to an object represents its internal state. An object's internal state can influence the object's behavior. For example, an object representing a living creature may have a property corresponding to hunger. If the creature's hunger exceeds a certain level, the creature may subsequently search for food rather than initiate another behavior. In general, changes to an object's internal state in prior art simulation systems and methods occur without the user's knowledge. That is, they occur invisibly during the execution of a simulation. In addition, the simulation user cannot define or modify an object's internal state after simulation execution has begun. When the user's knowledge of and access to each object's internal state is limited, the simulation again becomes less effective as an educational tool.

Therefore, there is a need for a means of providing simulation users with flexible control over simulation information and simulation behavior without requiring specialized programming knowledge.

SUMMARY OF THE INVENTION

The present invention is an extensible simulation system and graphical programming method that provides an easy-to-use simulation programming environment. The present invention combines programming by demonstration and Graphical Rewrite Rules to allow the user to effectively program without specialized knowledge of computer languages or programming concepts. Taken separately, neither programming by demonstration nor Graphical Rewrite Rules provide the user with this ability. Rather, it is their combination, as seen for the first time in the present invention, that provides the ordinary simulation user with the ability to program. The present invention enables the user to program novel simulation behaviors that had not been anticipated by the simulation creators. By interacting with the simulation programming environment, the simulation user can initiate and terminate the execution of a simulation; create and delete objects; selectively place one or more objects into the simulation; and selectively view, modify, and program information corresponding to the behaviors or properties of one or more objects.

The extensible simulation system preferably comprises a Central Processing Unit (CPU), an input device, an output device, an external storage device, predetermined amounts of Random Access Memory (RAM) and Read-Only Memory (ROM), and an extensible simulator. Each element of the extensible simulation system has an input and an output coupled to a common system bus. The extensible simulator comprises an object source, a simulation viewer, a Graphical Rewrite Rule (GRR) editor, an action recorder, an abstractor, a drawing editor, an object property editor, an object rule viewer, a subroutine editor, and a simulation execution controller. Each element of the extensible simulator has an input and an output coupled to the common system bus. The extensible simulator's components produce one or more corresponding graphical windows, menus, icons, and affordances that are displayed on the output device. The graphical windows, menus, icons, and affordances preferably include an object source window; a simulation viewer window; a GRR editor window; a drawing editor window; an object rule window; an object property editor window; a subroutine editor window; and an execution control menu. The set of graphical windows, menus, icons, and affordances that are available to the simulation user forms a user interface that allows the simulation user to perform functions within the simulation programming environment.

The object source provides the user with a set of simulation objects or characters via the object source window. Each object preferably maintains a picture or appearance, a type, a name, a set of object properties or characteristics, and a set of Graphical Rewrite Rules. For each instance of a given object in a simulation, the object source maintains a pointer to uniquely identify the instance. The object source displays each object's picture in the object source window.

The simulation viewer divides a simulation into a set of simulation grid elements having predetermined graphical characteristics. The simulation viewer presents a simulation to the user as one or more scenes. Each scene comprises a subset of simulation grid elements and is displayed in the simulation viewer window. The user places objects in a simulation by copying them from the object source window to a desired location in a given simulation scene. During simulation execution, the simulation viewer updates the simulation viewer window according to each object action that occurs. The simulation viewer also enables the user to monitor changes in an object's internal state through the use of a heads-up object property display. The heads-up object property display provides a list of object properties and their current values that is selectively displayed with a corresponding object during simulation execution. The simulation user determines which object properties are included in the list.

The GRR editor enables the user to define the set of Graphical Rewrite Rules for a selected simulation object through programming by demonstration. Each GRR defines one or more actions that are conditionally performed by or upon the selected object during simulation execution. For each GRR, the user indicates a corresponding simulation context to define the GRR's "before" portion. The simulation context is a subset of simulation grid elements containing the selected object. In addition to containing the selected object, the simulation context may contain additional objects. Initially, the "after" portion of a GRR is identical to the "before" portion. During GRR definition, the GRR editor displays copies of the simulation contexts for the GRR "before" and "after" portions. During programming by demonstration, the user indicates each desired object action to the GRR editor by editing the "after" portion or the simulation viewer. For each object action, the GRR editor updates the GRR's "after" portion. An action can be indicated by directly moving the selected object from one simulation grid element to another within the simulation context provided by the GRR editor; or by defining a set of operations to be performed upon one or more object properties. An animated transition that alters a portion of the selected object's picture can be associated with an action. Animated transitions are created under the direction of the drawing editor. The GRR editor also allows the user to define a GRR's applicability to a simulation state based upon one or more object property conditions.

The action recorder automatically records each action and stores it in RAM. The set of actions recorded are referred to herein as a recording. The abstractor analyzes the recording, and from it creates a generalized sequence of computer program steps. The generalized sequence of computer program steps are referred to herein as a GRR program. The GRR editor allows the user to selectively view a GRR program as a sequence of symbolic program steps.

The system of the present invention also provides a variety of types associated with objects. A given object's type defines a hierarchical relationship between the object and other objects. The abstractor allows the user to hierarchically define a GRR's applicability to one or more objects according to object type.

The simulation execution controller directs the execution of a simulation, presents simulation information to the user, and allows the user to interrupt or terminate simulation execution via the execution control menu. During the execution of a simulation, the simulation execution controller sequentially tests Graphical Rewrite Rules for each object the user has included in the simulation. If a GRR's "before" portion matches a simulation state occurring in the simulation, the simulation execution controller executes the GRR program corresponding to the matching GRR. Execution of the GRR program results in the performance of the actions the user has defined through programming by demonstration, and thus, transforms the simulation state that originally matched the GRR's "before" portion into one which matches the GRR's "after" portion.

The graphical programming method of the present invention comprises the steps of: selecting an object; defining a new GRR for the selected object through programming by demonstration; and performing a GRR abstraction.

DETAILED DESCRIPTION OF THE PREFERRED EMBODIMENTS

Figure 1:
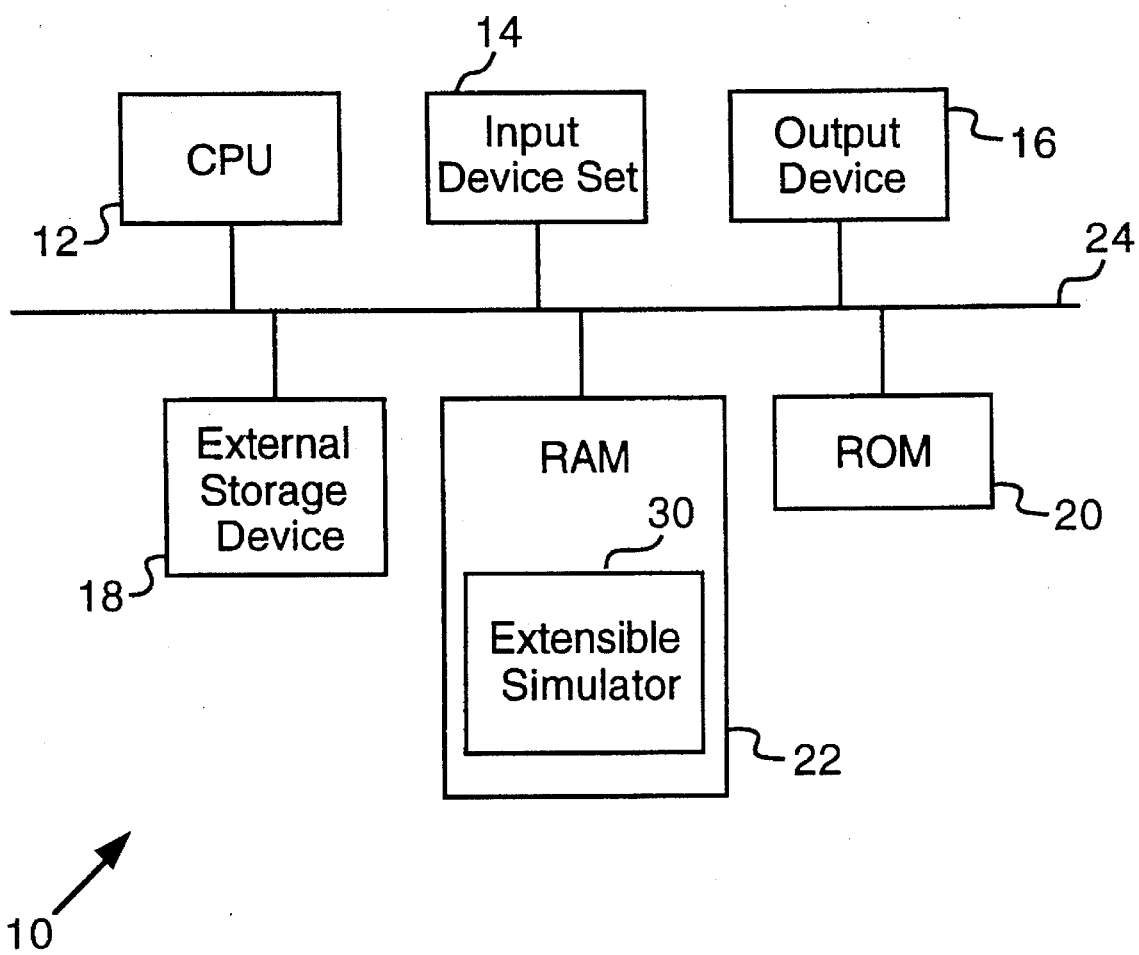
FIG. 1 is a block diagram of a preferred embodiment of an extensible simulation system constructed in accordance with the present invention.

Referring now to FIG. 1, a preferred embodiment of an extensible simulation system 10 constructed in accordance with the present invention is shown. The system 10 preferably comprises a Central Processing Unit (CPU) 12, an input device 14, an output device 16, an external storage device 18, and predetermined amounts of Read-Only Memory (ROM) 20 and Random Access Memory (RAM) 22. In the preferred embodiment of the system 10, an extensible simulator 30 resides in RAM 22. Each element of the system 10 has an input and an output coupled to a common system bus 24. In an exemplary embodiment, the system 10 of the present invention is an Apple Macintosh computer system having a Motorola MC68430 CPU, a keyboard and a mouse-type controller, a color graphics monitor, 8 Mb of RAM, a 20 Mb or larger hard disk drive, and the extensible simulator 30 of the present invention.

Figure 2:
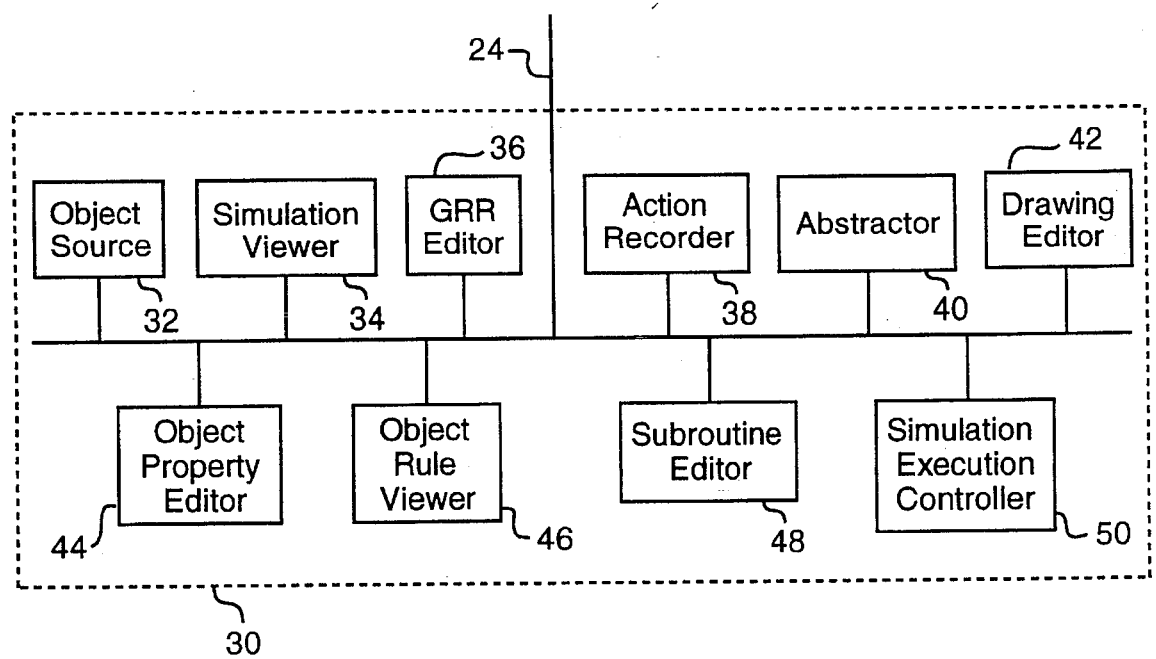
FIG. 2 is a block diagram of a preferred embodiment of an extensible simulator of the present invention.

Referring now to FIG. 2, a block diagram of a preferred embodiment of the extensible simulator 30 of the present invention is shown. The extensible simulator 30 preferably comprises an object source 32, a simulation viewer 34, a Graphical Rewrite Rule (GRR) editor 36, an action recorder 38, an abstractor 40, a drawing editor 42, an object property editor 44, an object rule viewer 46, a subroutine editor 48, and a simulation execution controller 50. These components of the extensible simulator 30 have an input and an output coupled to the common system bus 24. In the preferred embodiment, each element of the extensible simulator 30 is a computer program step sequence stored in RAM 22, which selectively controls the operation of the CPU 12.

In the present invention, a simulation is a group of objects exhibiting user-defined behaviors. In the simulation, each object occupies a position within a set of simulation grid elements. The extensible simulator 30 enables a simulation user to define and modify the possible behaviors the objects can exhibit during the simulation's execution. The extensible simulator 30 also allows the simulation user to define properties or characteristics associated with each object, to selectively modify property values, and to specify how one or more properties will influence the object's behavior.

In the preferred embodiment of the present invention, each possible behavior of a given object is determined by a corresponding user-defined GRR. Each GRR has a "before" portion and an "after" portion. The "before" portion graphically represents a state associated with the object that can occur during simulation execution. The "after" portion graphically represents the state the object is to transition to when the state indicated by the "before" portion occurs. In other words, the "after" portion shows what is to happen to the object following the "before" portion's occurrence during simulation execution.

The simulation user defines a GRR corresponding to a given object through programming by demonstration. During programming by demonstration, the user graphically indicates actions that are to be performed by or upon the given object or one or more associated objects. The user indicates each action with the input device 14 by dragging and dropping a selected object or by selecting a predetermined user interface element displayed on the output device 16. The actions indicate the manner in which the object is to transition between the states shown by the GRR's "before" and "after" portions. In the preferred embodiment, the performance of an action during simulation execution can affect an object in one of three possible ways, namely 1) by moving the object from one location to another in the simulation; 2) by changing one or more object properties; or 3) by altering the object's appearance. Those skilled in the art will recognize that in an alternate embodiment, an object could be affected in other ways. The extensible simulator 30 records and stores each action as a portion of a recording. Once a recording has been created, the extensible simulator 30 analyzes the recording and creates a corresponding generalized sequence of computer program steps. The set of computer program steps created for a given GRR are referred to herein as the GRR's program.

The combination of Graphical Rewrite Rules and programming by demonstration in the present invention enable the ordinary simulation user to program a simulation without requiring specialized knowledge of computer programming languages or concepts. Systems and methods in the prior art have been unsuccessful in providing ordinary simulation users with adequate programming capabilities because they lack this unique combination of Graphical Rewrite Rules and programming by demonstration.

Figure 3A:
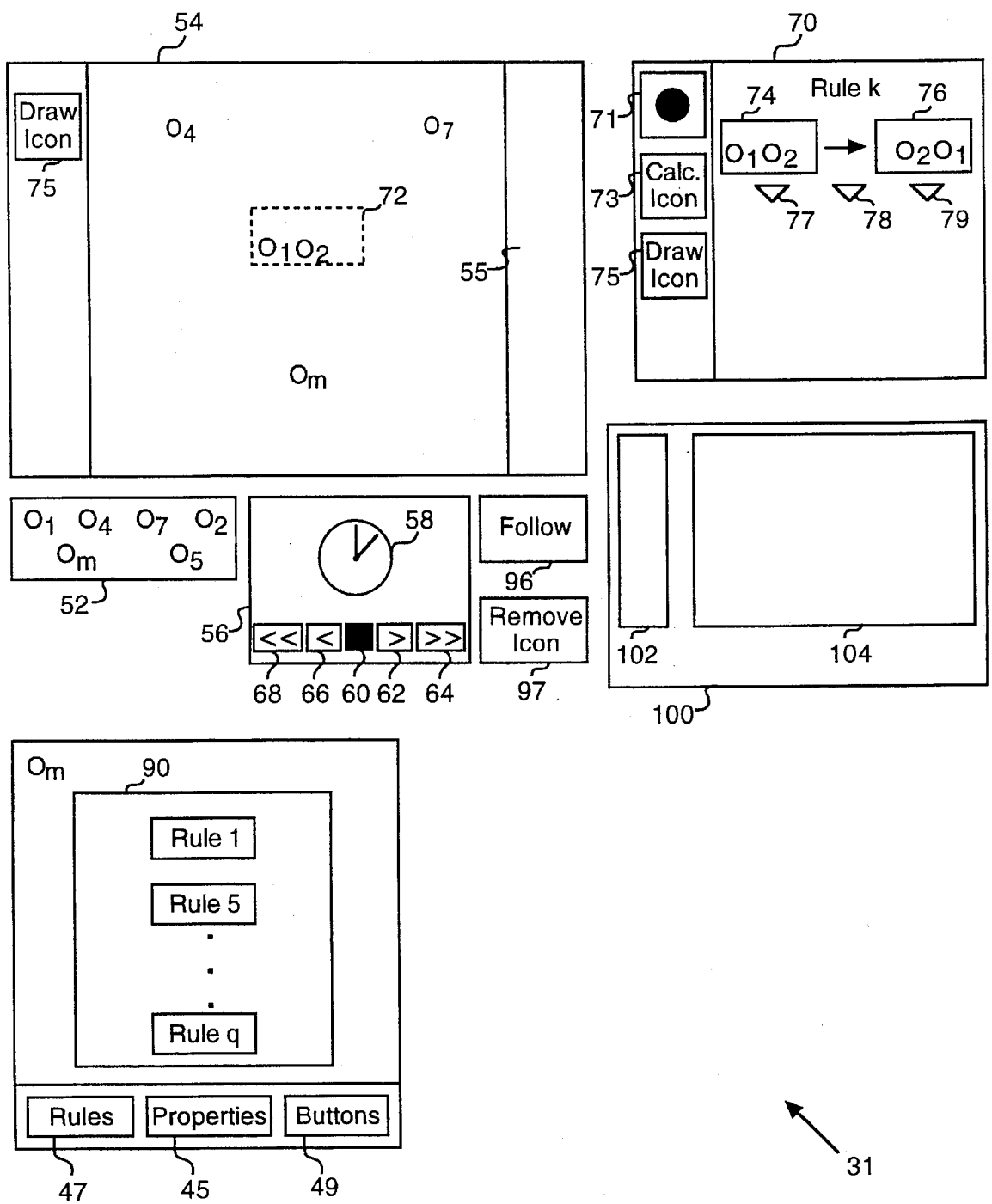
FIGS. 3A, 3B, and 3C are block diagrams showing a preferred embodiment of a user interface of the present invention.
Figure 3B:
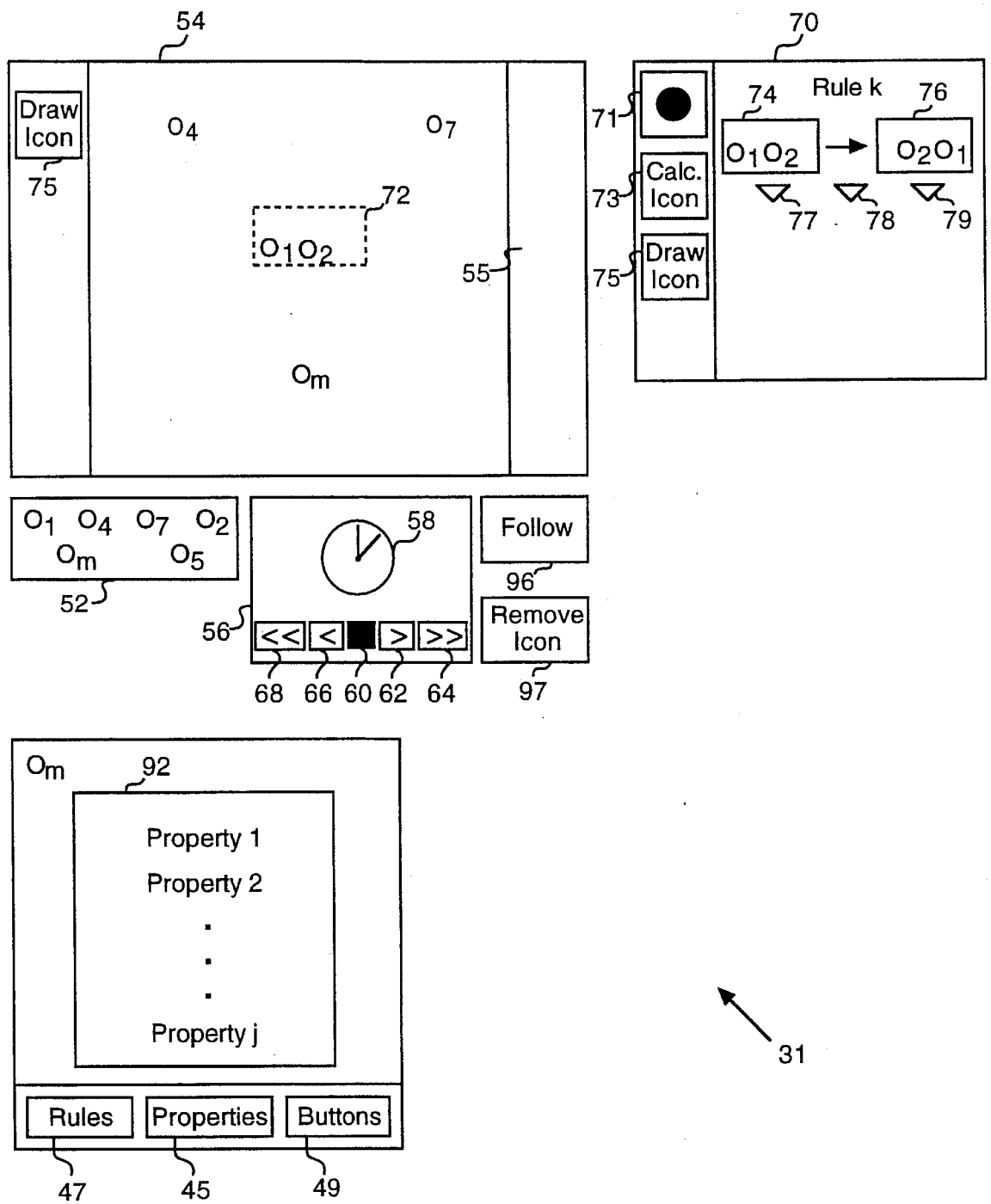
Figure 3C:
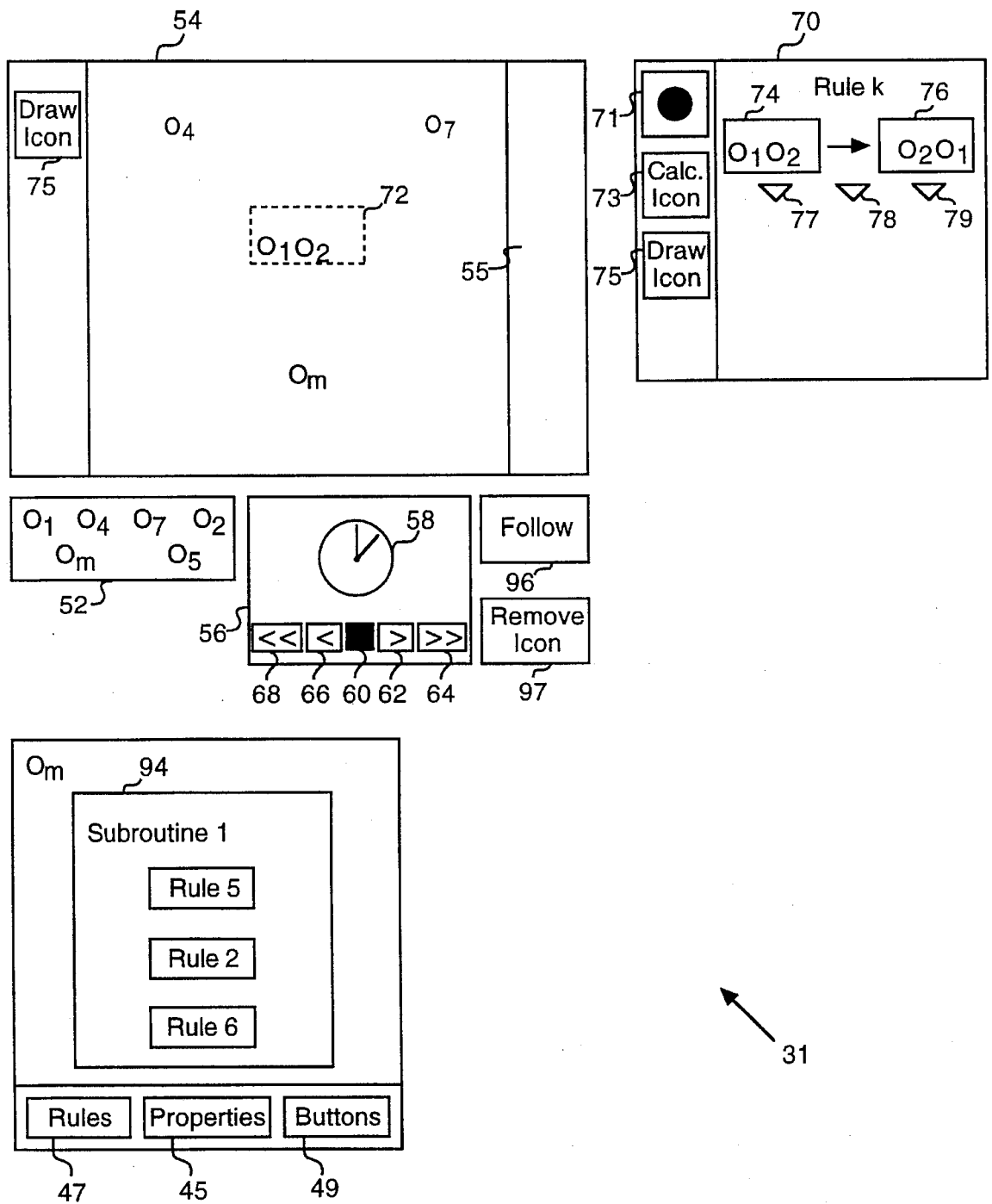
Figure 13A:
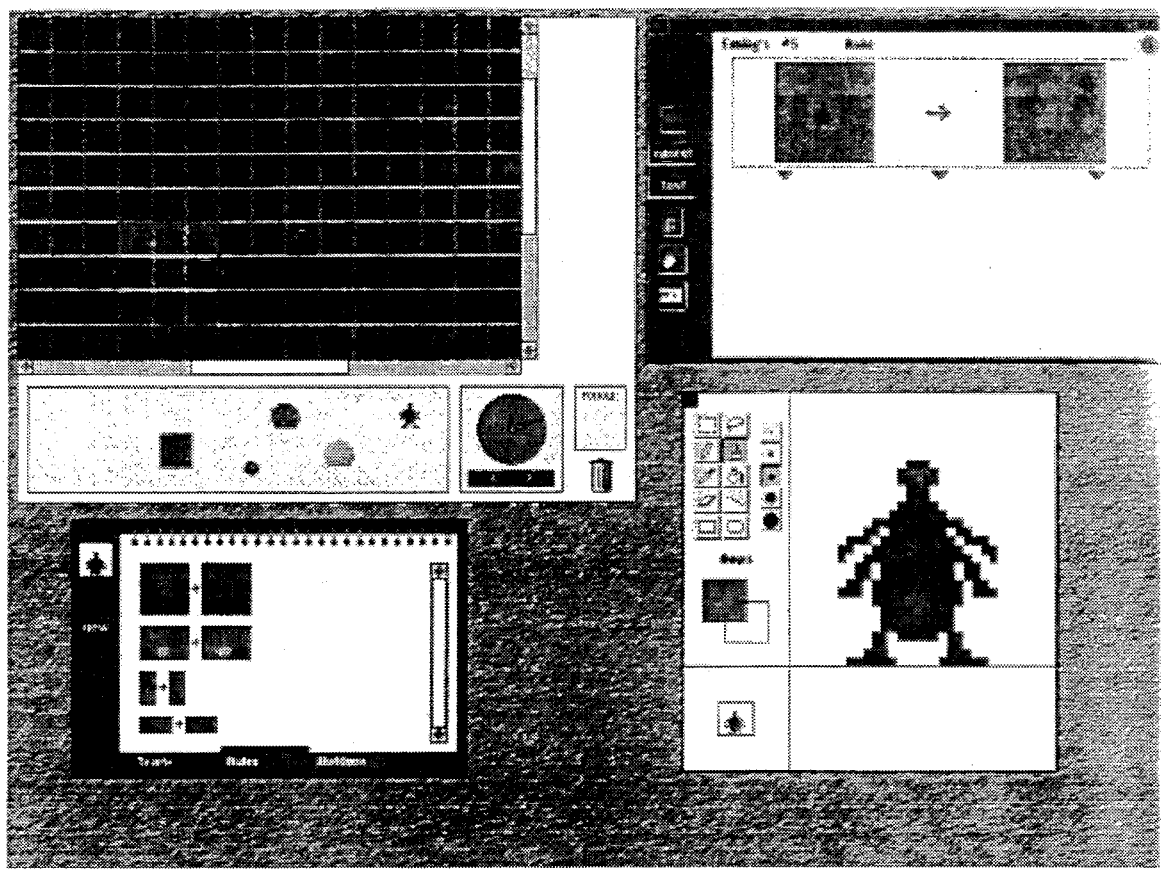
FIGS. 13A through 13I are block diagrams showing a preferred embodiment of the user interface of the present invention.
Figure 13B:
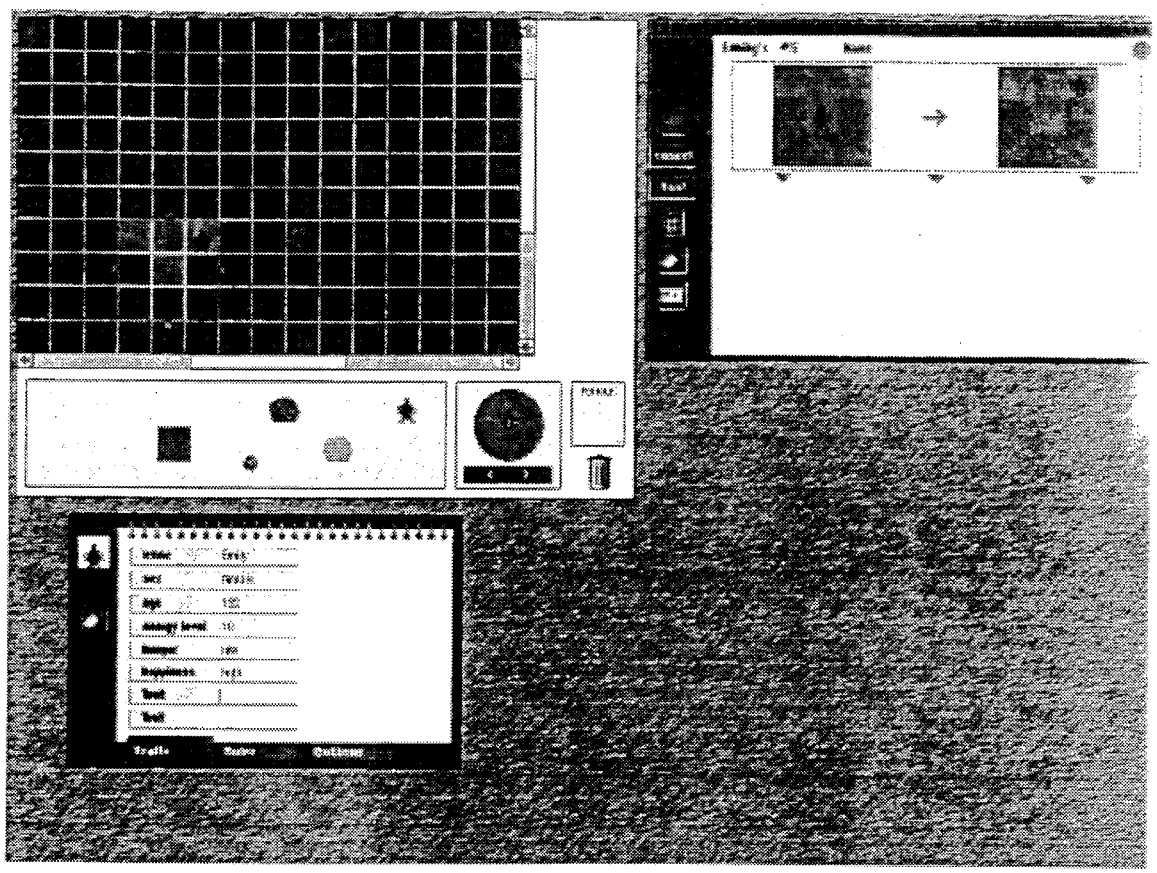
Figure 13C:
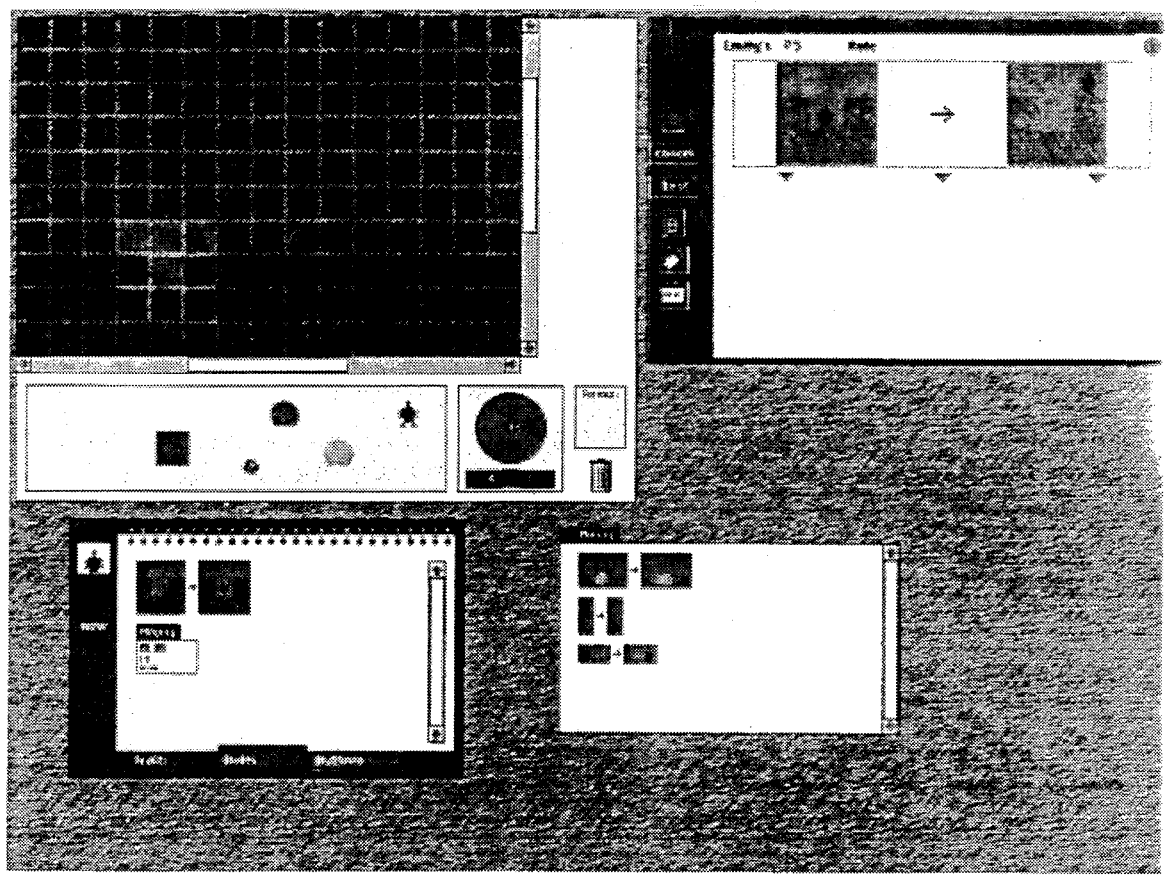

In the preferred embodiment, some of the elements in the extensible simulator 30 generate and display one or more corresponding graphical windows, menus, icons, or affordances on the output device 16. Each graphical window, menu, icon, and affordance conveys simulation information to the simulation user. The graphical windows, menus, icons, and affordances displayed to the user on the output device 16 are referred to as a user interface 31. Referring also now to FIGS. 3A, 3B, and 3C, a set of block diagrams showing a preferred embodiment of the user interface 31 for the extensible simulator 30 of the present invention is shown. FIGS. 13A, B & C show the preferred embodiment user interface 31 as obtained through a display screen capture program. FIGS. 13A, B & C correspond to FIGS. 3A, 3B, and 3C, respectively. The user interface 31 preferably comprises an object source menu 52, a simulation viewer window 54, an execution control window 56, a GRR editor window 70, an object rule viewer window 90, an object property editor window 92, a subroutine editor window 94, an object follower window 96, an object remove icon 97, and a drawing editor window 100. Those skilled in the art will recognize that additional or fewer graphical windows, menus, icons, affordances, or other user interface techniques could be present in an alternate embodiment of the user interface 31. The output device 16 typically possesses a limited area upon which information can be displayed. Therefore, in the preferred embodiment, predetermined regions on the output device 16 can be used to selectively display multiple graphical windows or menus. In addition, "pop-up" or temporary graphical windows are used to selectively display simulation information that the simulation user may require only occasionally. For example, the drawing editor window 100 is a temporary window that is displayed only when required by the user. The user is allowed to resize or selectively position elements of the user interface 31 on the output device 16. In FIGS. 3A, 3B, and 3C, the object rule viewer window 90, the object property editor window 92, and the subroutine editor window 94, respectively, are selectively displayed in the same region on the output device 16, thereby conserving display space while providing the simulation user with easy access to desired information. FIG. 3A and FIG. 13A show the user interface 31 when the object rule viewer window 90 is displayed; FIG. 3B and FIG. 13B show the user interface 31 when the object property editor window 92 is active; and FIG. 3C and FIG. 13C show the user interface 31 when the subroutine editor window 94 is displayed. The drawing editor window 100 is shown only in FIG. 3A.

The object source 32 provides the user with simulation objects that can be selected for inclusion in the simulation. For each instance of an object, the object source 32 maintains a picture, an object type, an object name, a set of object properties, and a set of corresponding Graphical Rewrite Rules in RAM 22. The object source 32 creates and maintains a unique pointer to each instance of a given object present in a simulation. The object source 32 also generates and displays the object source menu 52. Within the object source menu 52, the object source 32 displays the picture of each object that is available to the simulation user. In the preferred embodiment, the user selects and places one or more instances of a given object into the simulation by moving or "dragging" the object's picture from within the object source menu 52 to a desired location in the simulation viewer window 54.

The simulation viewer 34 represents a simulation as the set of simulation grid elements and the location of each object contained therein. An object in the simulation occupies a predetermined number of simulation grid elements, and can move from one location to another within the set of simulation grid elements according to its corresponding Graphical Rewrite Rules during simulation execution. When the user adds an object to the simulation, the simulation viewer 34 records the object's location in an object location list stored in RAM 22. The simulation viewer 34 presents the simulation to the user as a scene displayed in the simulation viewer window 54. Each scene is a portion or a subset of all the simulation grid elements forming the simulation. In the preferred embodiment, each simulation grid element is preferably a grid square having predetermined graphical characteristics. During simulation execution, the simulation viewer 34 scans the object location list, and displays the picture of each object present in the displayed scene at its proper location. In the simulation viewer window 54 of FIGS. 3A, 3B, and 3C, exemplary objects $O_1$, $O_2$, $O_4$, $O_7$, and $O_m$ are present.

Within the simulation viewer window 54, the simulation viewer 34 also maintains a "time-out" region 55. The simulation viewer 34 allows the user to move or drag a selected object displayed in the simulation viewer window 54 into the time-out region 55 if the user desires to temporarily remove the selected object from the simulation. When the user moves an object into the time-out region 55, the simulation viewer 34 deletes the object's location from the object location list. While the object is in the time-out region 55, no actions are performed by or upon the object. In other words, the object's state is preserved while it is in the time-out region 55. The user can place the object back in the simulation when desired by moving the object from the time-out region 55 into the simulation viewer window 54. This in turn causes the simulation viewer 34 to insert the object's new location into the object location list, and resumes the object's participation in the simulation.

The remove icon 97 enables the simulation user to delete an object from the simulation viewer window 54 or from the object source 32. In the preferred embodiment, the user deletes a selected object by dragging the selected object from the simulation viewer window 54 or the object source window 52 to the remove icon 97. The remove icon 97 also allows the user to delete a given GRR displayed in the object rule viewer window 90 in an analogous manner. The remove icon 97 functions in a manner similar to the trash can icon in the Macintosh user interface produced by Apple Computer, Inc., but provides a generalized delete capability. Additional items that can be deleted via the remove icon 97 include object properties and user-defined calculations.

The drawing editor 42 provides the user with the ability to edit an object's picture, thereby changing the object's appearance. The drawing editor 42 also allows the user to create one or more animated transitions corresponding to object actions during GRR definition or editing. The user selectively causes the drawing editor 42 to display the drawing editor window 100 by selecting a drawing editor icon 75 displayed on the user interface 31. In the preferred embodiment, two instances of the drawing editor icon 75 are displayed. The drawing editor 42 signals the simulation viewer 34 to display a first instance of the drawing editor icon 75 in the simulation viewer window 54, and the drawing editor 42 signals the GRR editor 36 to display a second instance of the drawing editor icon 75 in the GRR editor window 70. Preferably, when the first drawing editor icon 75 instance is selected, the user can modify a selected object's picture. The second drawing editor icon 75 instance is preferably selected during GRR creation when the user desires to create an animated transition. In the preferred embodiment, the drawing editor 42 functions in a manner similar to conventional paint programs. The drawing editor 42 generates and displays an editing palette 102 that allows the user to select an editing tool such as a paintbrush or an eraser using the input device 14. The drawing editor 42 also generates a picture window 104, wherein the drawing editor 42 displays a selected object's picture as it is modified or as an animated transition is created.

A property is a name-value pair associated with an object. Each property includes a property name and a property value. The object property editor 44 allows the simulation user to define object properties as desired. For example, a property descriptor defined for an object representing an oak tree might be "height," with a corresponding property value of "5 meters." The object property editor 44 displays a selected object's properties via the object property editor window 92 as shown in FIG. 3B. In the preferred embodiment, the object property editor 42 is activated and its corresponding window is displayed when the user selects a properties button 45. The object property editor 44 enables the simulation user to utilize the input device 14 within the object property editor window 92 to define or modify properties corresponding to the selected object. In FIG. 3B, the object property editor window 92 indicates a set of object properties including Property 1, Property 2, and Property j for object $O_m$.

The object property editor 44 allows the user to define one or more supertypes that hierarchically interrelate objects. Each supertype is stored in RAM 22. A first and a second object type might be "oak tree" and "pine tree," respectively. Within the "oak tree" type, the user could further define a first exemplary object named "oak tree #7" and a second exemplary object named "oak tree #8." In a like manner, the user could define a third exemplary object named "pine tree #4" within the "pine tree" type. The user could define a first supertype as "tree," and a second supertype as "living thing." The extensible simulator 30 recognizes that two of the three exemplary objects share a common type (namely, "oak tree"), and that each of the three exemplary objects share two common supertypes (namely, "tree" and "living thing"). Those skilled in the art will recognize that additional supertypes can be defined in an analogous manner.

Because the extensible simulator 30 can hierarchically interrelate objects, the extensible simulator 30 enables the simulation user to hierarchically specify the applicability of a given GRR according to object name, object type or supertypes. Thus, the user can specify that a first GRR is applicable to "oak tree #7," but not to "oak tree #8." The user can also specify that a second GRR is applicable to any object associated with supertype "tree." Similarly, the user can modify a given GRR such that it is applicable to any object whatsoever. Herein, the modification of a GRR's applicability is referred to as abstraction.

The object rule viewer 46 is activated when the user selects a rules button 47. The object rule viewer 46 generates and displays the object rule viewer window 90. When the object rule viewer 46 is active and the user selects an object, the object rule viewer 46 preferably displays in miniature form the "before" and "after" portions of each GRR associated with the selected object as shown in FIG. 3A. Multiple object rule viewer windows 90 can be in use simultaneously. The user can copy rules displayed in a rule viewer window 90 associated with a given object into a rule viewer window 90 associated with another object, thereby copying rules from the given object's GRR set into the other object's GRR set. In FIG. 3A, the object rule viewer window 90 shows that the Graphical Rewrite Rules for object $O_m$ include Rule 1, Rule 5, and Rule q as shown in FIG. 3A.

The simulation user can combine rules to create subroutines. The subroutine editor 48 allows the user to define a subroutine for an object by selecting and ordering one or more rules in the object's rule list. In the preferred embodiment, the user activates the subroutine editor 48 by selecting a subroutine button (not shown) from within the object rule viewer window 90. The user interacts with the subroutine editor 48 by using the input device 14 within the subroutine editor window 94 as shown in FIG. 3C. Each subroutine defined for an object is itself listed in the object's rule list. In FIG. 3C, the subroutine editor window 94 shows that Subroutine 1 for object $O_m$ contains Rule 5, Rule 2, and Rule 6.

The GRR editor 36 enables the user to create and modify Graphical Rewrite Rules through programming by demonstration. When a GRR is created, the GRR editor 36 stores its "before" and "after" portions in RAM 22. Information exchange between the user and the GRR editor 36 occurs via the GRR editor window 70. Within the GRR editor window 70, the GRR editor 36 generates and displays a "before" portion window 74, an "after" portion window 76, a completion button 71, a calculator icon 73, the second drawing editor icon 75, a property condition button 77, a view program button 78, and a property modification button 79. In addition, the GRR editor 36 signals the simulation viewer 34 to maintain a simulation context indicator 72 in the simulation viewer window 54 during GRR creation or editing.

Each GRR corresponds to a selected object. For each GRR, the user defines a simulation context by positioning the simulation context indicator 72 in the simulation viewer window 54. During GRR creation or editing, the simulation viewer 34 preferably delineates each simulation grid element in the scene displayed in the simulation viewer window 54. In the preferred embodiment, the simulation viewer 34 displays the simulation context indicator 72 as an outlined box surrounding one or more simulation grid elements. The simulation context interrelates the selected object, a subset of simulation grid elements containing the selected object, and any other objects contained therein according to their relative positions, simulation grid element occupancy, a set of hierarchical object classifications, and a set of property conditions. The simulation context is a simulation state that can occur during the simulation's execution. The initially defined simulation context defines the "before" portion of the GRR. In FIGS. 3A, 3B, and 3C, the simulation context indicator 72 contains objects $O_1$ and $O_2$. The "before" portion window 74 displays the "before" portion of the GRR to the user. Similarly, the "after" portion window 76 displays the GRR's "after" portion. In the definition of a new GRR, the "after" portion is initially identical to its "before" portion. In the preferred embodiment, the completion button 71 allows the user to indicate when GRR definition or editing has been completed.

Figure 13D:
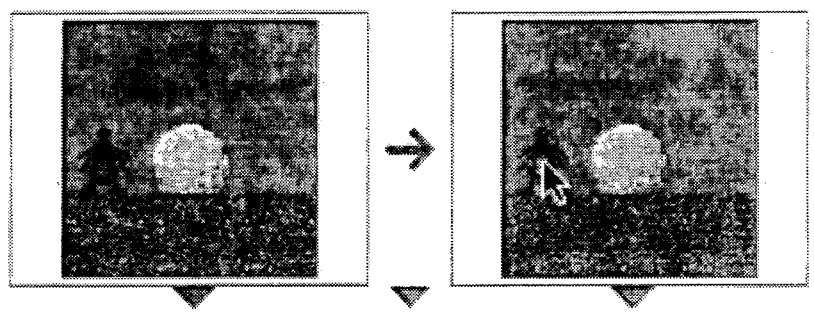
Figure 13E:
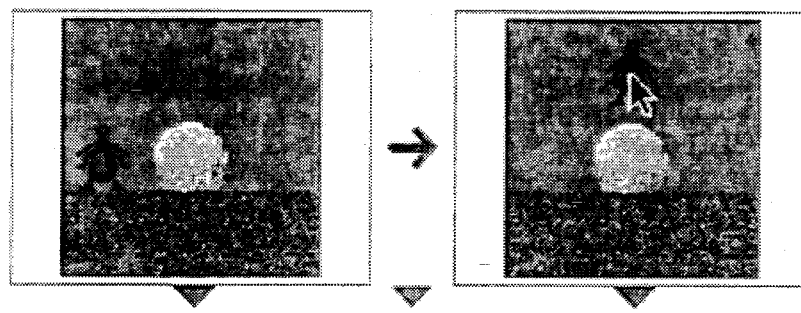
Figure 13F:
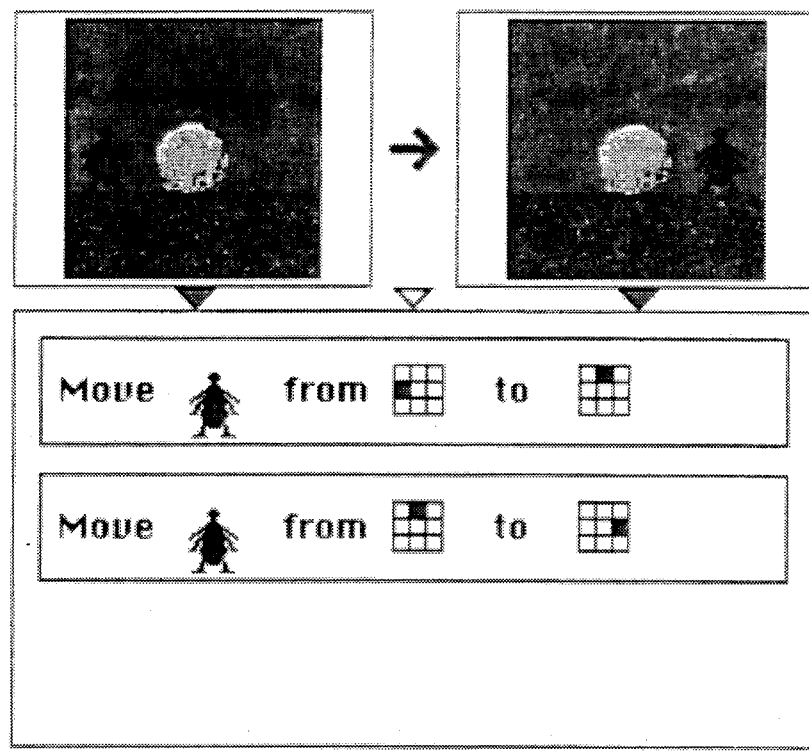

Referring also now to FIGS. 4A, 4B, 4C, 4D, and 4E, a sequence of block diagrams presenting portions of the user interface 31 during an exemplary GRR definition for object $O_1$ and a corresponding symbolic GRR program created through programming by demonstration is shown. In the exemplary GRR definition, object $O_2$ is adjacent to object $O_1$ as shown. FIGS. 13D, E & F A show the state of the simulation viewer window 54 and the GRR editor window 70 upon the user interface 31 during the exemplary GRR definition corresponding to FIGS. 4A, 4B, 4C, 4D, and 4E, as obtained by a display screen capture program. In FIGS. 13D, E & F, object $O_1$ is defined as "creature #5," and has a bug-like picture; and object $O_2$ is defined as "grey rock #76," and has a picture showing a rock. FIG. 13D corresponds to FIGS. 4A and 4B; FIG. 13E corresponds to FIG. 4C; and FIG. 13F corresponds to FIGS. 4D and 4E.

Figure 4A:
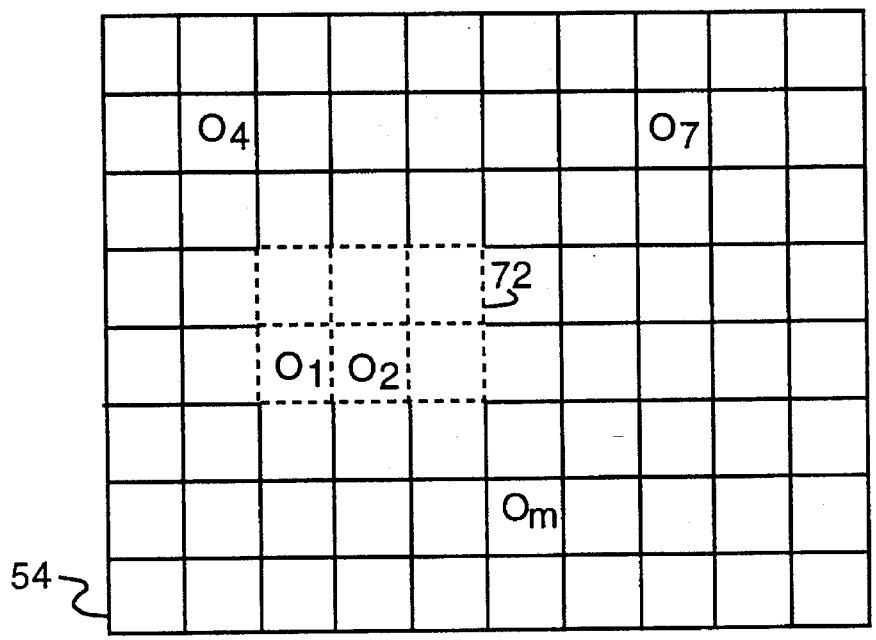
FIGS. 4A, 4B, 4C, 4D, and 4E are a sequence of block diagrams showing a portion of the user interface during an exemplary graphical rewrite rule definition through programming by demonstration.
Figure 4B:
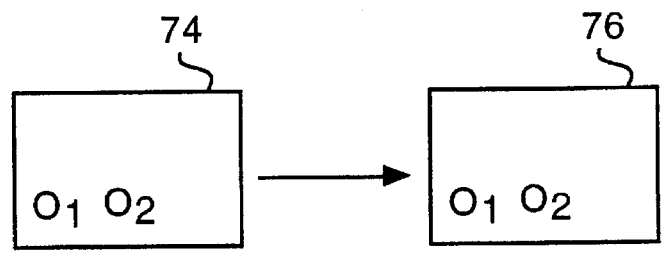
Figure 4C:
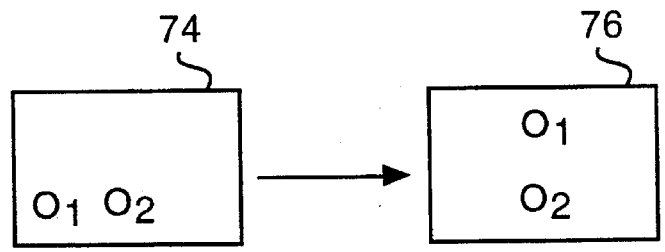
Figure 4D:
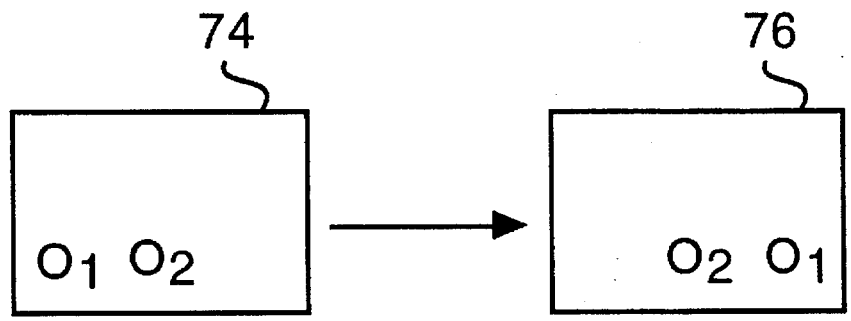

In the creation of a new GRR, the user first identifies an object to which the new GRR will apply. In the preferred embodiment, the user then selects a GRR definition button (not shown) from within the object rule viewer window 90. When an existing GRR is to be edited, the user selects the GRR from a selected object's rule list. In the preferred embodiment, the GRR editor 36 signals the simulation viewer 34 to delineate or outline the subset of simulation grid elements in the scene displayed in the simulation viewer window 54 during GRR creation or editing as shown in FIG. 4A and in FIG. 13D. The GRR editor 36 then signals the simulation viewer 34 to display the simulation context indicator 72 in the simulation viewer window 54. When a GRR is initially being defined, the simulation context indicator 72 encloses only the selected object and the simulation grid elements the selected object occupies. In the preferred embodiment, a previously-defined GRR can be edited only when the simulation state to which it corresponds appears in the scene currently displayed in the simulation viewer window 54. The simulation context indicator 72 can be advantageously adjusted by the user to span any subset of simulation grid elements containing the selected object, thereby defining the "before" portion of the GRR. This can be done by allowing the user to drag and drop graphical handles on each side of the simulation context indicator 72. As the simulation context indicator 72 is adjusted, the simulation viewer window 54, the "before" portion window 74, and the "after" portion window 76 are simultaneously updated.

The "before" portion of a GRR shows the selected object, a subset of simulation grid elements surrounding the selected object, and any additional objects contained therein. The GRR's "before" portion maintains the positions of each additional object and each simulation grid element in the subset relative to the selected object, the occupancy of each simulation grid element in the subset, plus a set of hierarchical object classifications and a set of property conditions for the objects in the subset.

In the example considered herein, object $O_1$ has been defined as the selected object, and the simulation context indicator 72 has been adjusted to span the six simulation grid elements indicated by dashed lines in FIG. 4A. In FIG. 13D, the simulation context indicator is outlined rather than dashed. Within the six simulation grid elements spanned by the simulation context indicator 72, object $O_2$ is adjacent to object $O_1$ as shown. The "before" portion of the exemplary new GRR identified by the simulation context indicator 72 in FIG. 4A and its initial "after" portion are shown in the "before" portion window 74 and "after" portion window 76, respectively, in FIG. 4B. The "before" portion window 74 and the "after" portion window 76 are also shown within the GRR editor window 70 in FIG. 13D.

In the definition of the GRR through programming by demonstration, the GRR editor 36 enables the user to demonstrate or define a corresponding sequence of actions to be performed by or to be performed upon one or more objects. Each action occurs within the subset of simulation grid elements identified by the simulation context indicator 72. In the preferred embodiment, the user can define object motion actions and property modification actions. An object motion action is defined by moving a selected object from either the object source menu 52 or a first simulation grid element to either the delete icon 97 or a second simulation grid element. A property modification action is defined by specifying a set of operations to be performed upon one or more object properties. Those skilled in the art will recognize that additional types of actions could also be defined. If the user selects the drawing editor icon 75 during GRR editing or definition, the drawing editor 42 allows the user to create an animated transition corresponding to an action. During simulation execution, performance of the action to which the animated transition corresponds causes one or more portions of an object's picture to be altered according to the animated transition. A single GRR may have several corresponding actions defined for the object in any of the manners indicated above. Each action alters the state of the selected object in the "after" portion window 76. In the preferred embodiment, an object's state is altered when the object's position changes, when one or more of the object's property values change, or when the object's visual appearance changes. If an action involves the movement of the object from one simulation grid element to another, the user can move the object in the simulation viewer window 54, or the user can move the object in the GRR editor's "after" portion window 76. Movement of the object in the simulation viewer window 54 automatically results in corresponding movement of the object in the "after" portion window 76, and vice versa.

In the preferred embodiment, the user indicates that a property modification action is to be defined or edited by selecting the property modification button 79. When the property modification button 79 is selected, the user can drag a selected property from the object property editor window 92 into a first predetermined region in the GRR editor window 70. The GRR editor 36 then assigns the value of the selected property to a first portion of an equation. The user can then specify the manner in which the selected property is to be modified. In the preferred embodiment, the user specifies this by defining or editing a calculation having a result that is to be assigned to the selected property. The calculation is displayed in a second predetermined region in the GRR editor window 70, and can include one or more constants, the values of one or more object properties, and one or more operators. If the user selects the calculator icon 73, a calculator window 81 (shown in FIG. 5B) is displayed to assist the user in definition of the calculation. In the preferred embodiment, the GRR editor 36 assigns the calculation to a second portion of the equation, and the equation is stored in RAM 22 after the property modification action has been defined.

For each action the user defines or demonstrates, the action recorder 38 automatically records and stores the action as a portion of a recording. Each recorded action indicates an exact operation that is to be performed by or upon a specific object. After the action recorder 38 has recorded and stored an action, the abstractor 40 analyzes the recorded action, generalizes the recorded action, and creates a corresponding generalized computer program step sequence. The abstractor's generalization of the recorded action is referred to herein as event abstraction. In the preferred embodiment, event abstraction takes on two forms, namely, motion abstraction and property abstraction. Motion abstraction and property abstraction correspond to the generalization of object motion actions and property modification actions, respectively. During motion abstraction, exact object locations are generalized according to their relative position within the GRR's "before" portion. During property abstraction, specific property values are generalized. When executed, the generalized computer program step sequence results in the desired action being performed by or upon the object.

In the preferred embodiment, each action demonstrated by the user falls within a predefined number of possible action types. The abstractor 40 preferably stores each generalized computer program step sequence recorded for a given GRR sequentially in RAM 22. The set of generalized computer program step sequences generated is the GRR program. In the example considered herein, a first action is defined in FIG. 4C by moving object $O_1$ to the simulation grid element directly above object $O_2$. Following definition of the first action, the action recorder 38 automatically records a the action as a first portion of a recording. The abstractor 40 then analyzes the first portion of the recording, and creates a generalized computer program step sequence corresponding to the first action. The "after" portion window 76 following demonstration of the first action is shown within the GRR editor window 70 in FIG. 13E. A second action is defined in FIG. 4D by moving object $O_1$ to the simulation grid element directly to the right of object $O_2$. After definition of the second action, the action recorder 38 automatically records the second action as a second portion of the recording. The abstractor 40 then analyzes the second portion of the recording, and creates a generalized computer program step sequence corresponding to the second action. The "after" portion window 76 following demonstration of the second action is shown within the GRR editor window 70 in FIG. 13F. No further actions are defined in the current example. In the preferred embodiment, the user selects the completion button 71 when GRR definition or editing has been completed. After completion of GRR definition or editing, the GRR's "after" portion shows the state of the simulation context according to the final action the user had defined.

Figure 4E:
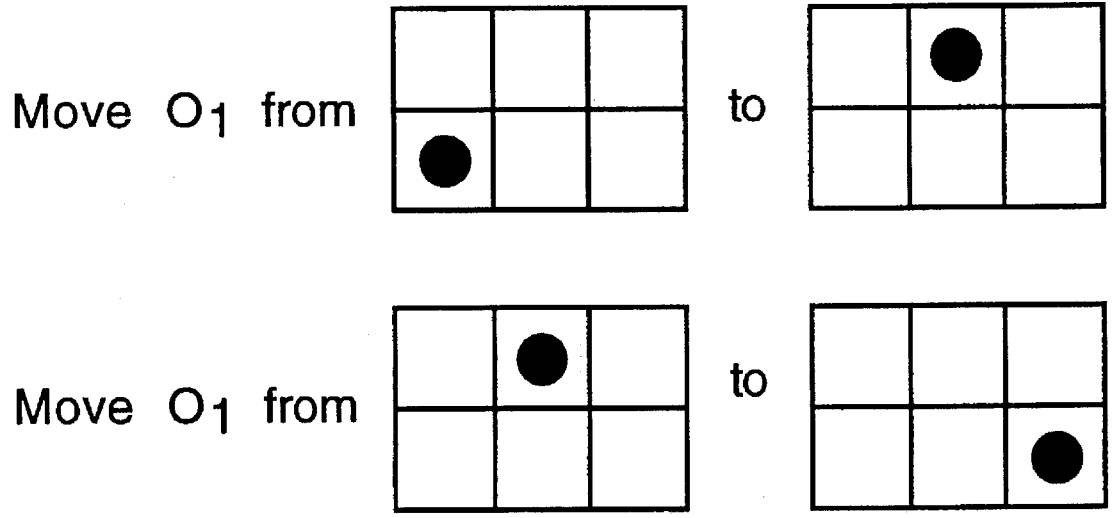

The GRR editor 36 enables the user to view in a mixed graphical and language form, the set of computer program step sequences defined for a given GRR. The GRR editor 36 of the present invention displays each computer program step sequence as a symbolic program step. In the preferred embodiment, the user selects the view program button 78 when symbolic program step display is required. Each symbolic program step provides the user with a visual indication of the object's behavior during execution of the GRR program. The symbolic program steps for the current example are shown in FIG. 4E and in the GRR editor window 70 in FIG. 13F. The first symbolic program step shows that object $O_1$ is to move from the lower-left simulation grid element in the subset to the upper-center simulation grid element. Similarly, the second symbolic program step shows that object $O_1$ is then to move from the upper-center simulation grid element in the subset to the lower-right simulation grid element. The representation of each computer program step sequence in symbolic form helps the user to understand the complete GRR program without specialized programming knowledge.

During the execution of a simulation, the simulation successively changes from one state to another as objects behave according to their corresponding Graphical Rewrite Rules. A given GRR's "before" portion matches a simulation state when the following conditions are satisfied: 1) the objects in the GRR's "before" portion occupy the same relative positions as a set of objects in the simulation state; 2) the simulation grid elements in the "before" portion are identical in number, relative position, and object occupancy to a subset of simulation grid elements surrounding the set of objects in the simulation state; 3) the objects in the GRR's "before" portion and the set of objects in the simulation state are related according to the set of hierarchical object classifications defined for the GRR; and 4) the set of objects in the simulation state satisfy the set of property conditions defined for the objects in the GRR's "before" portion.

During the definition of a new GRR corresponding to a selected object, the abstractor 40 preferably establishes default values for the set of hierarchical object classifications corresponding to the selected object and any additional objects in the GRR's "before" portion. In the preferred embodiment, the default hierarchical object classifications specify that the selected object is considered according to its name and any additional objects are considered according to their types when the GRR is tested for a match. A case in which object $O_1$ is defined as creature #5 and object $O_2$ is defined as grey rock #76 when the above exemplary GRR was defined is now considered. In this case, a first simulation state in which creature #5 and grey rock #76 occupy the lower-left and lower-center simulation grid elements, respectively, within a subset of simulation grid elements having positional and object occupancy relationships identical to those shown in the exemplary GRR's "before" portion obviously constitutes a match. A second simulation state that differs from the first simulation state in that grey rock #30 replaces grey rock #76 also constitutes a match because grey rock #76 and grey rock #30 have the same object type, namely, grey rock. Thus, as defined above, the exemplary GRR is applicable to both the first and the second simulation states.

Figure 5A:
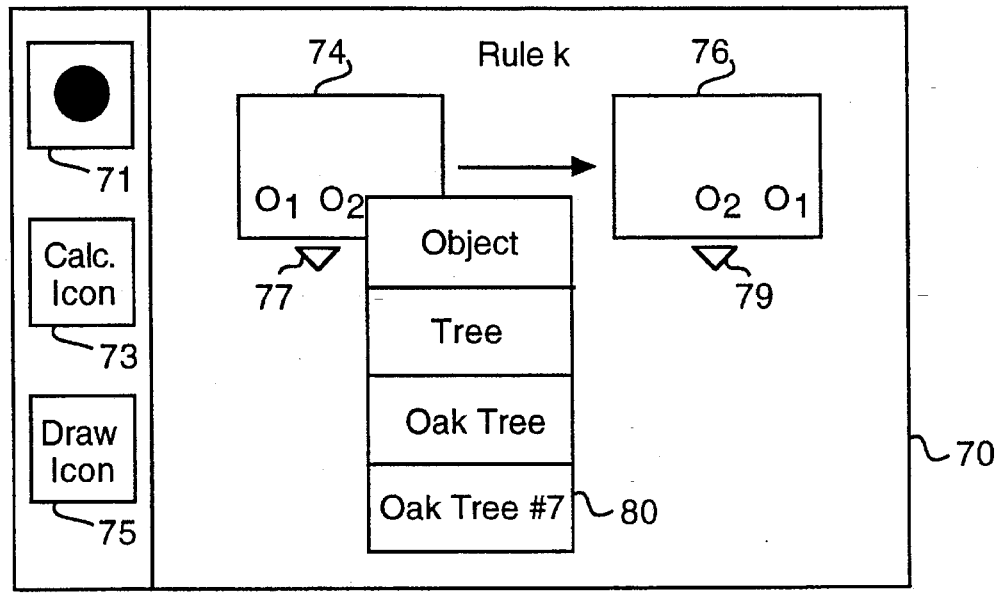
FIGS. 5A and 5B are block diagrams showing a portion of the user interface during an exemplary graphical rewrite rule abstraction.
Figure 13G:
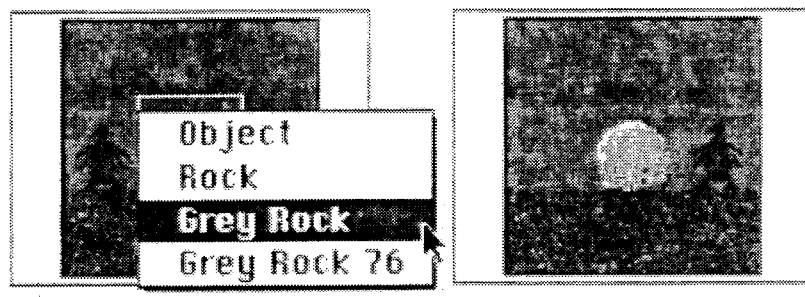
Figure 13H:
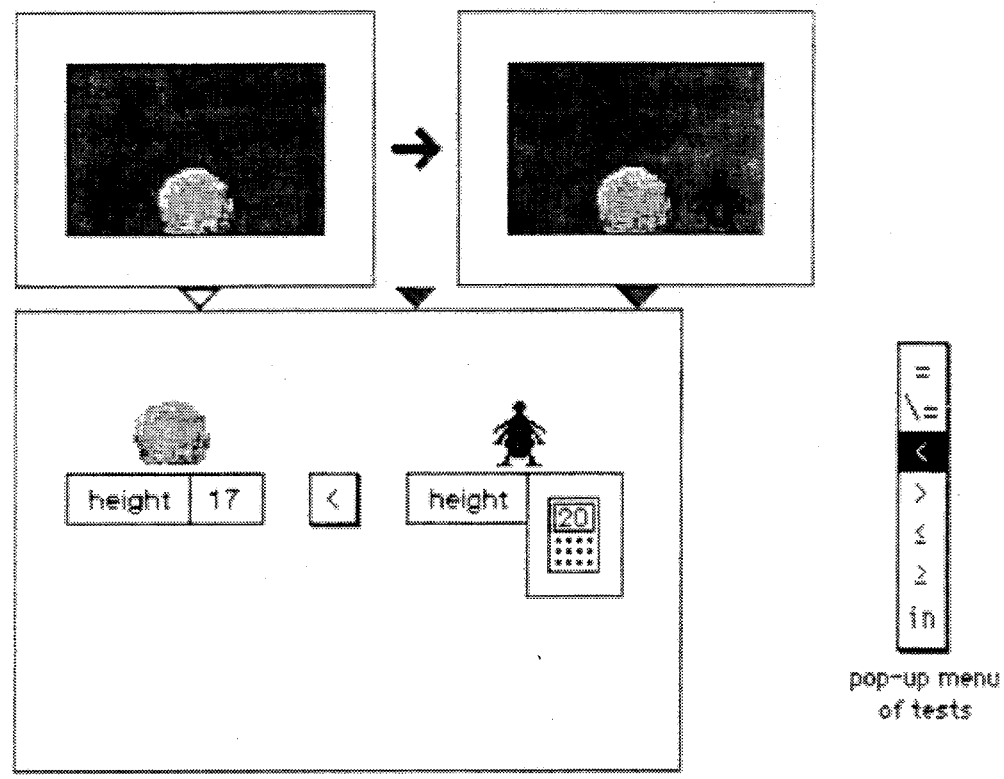
Figure 13I:
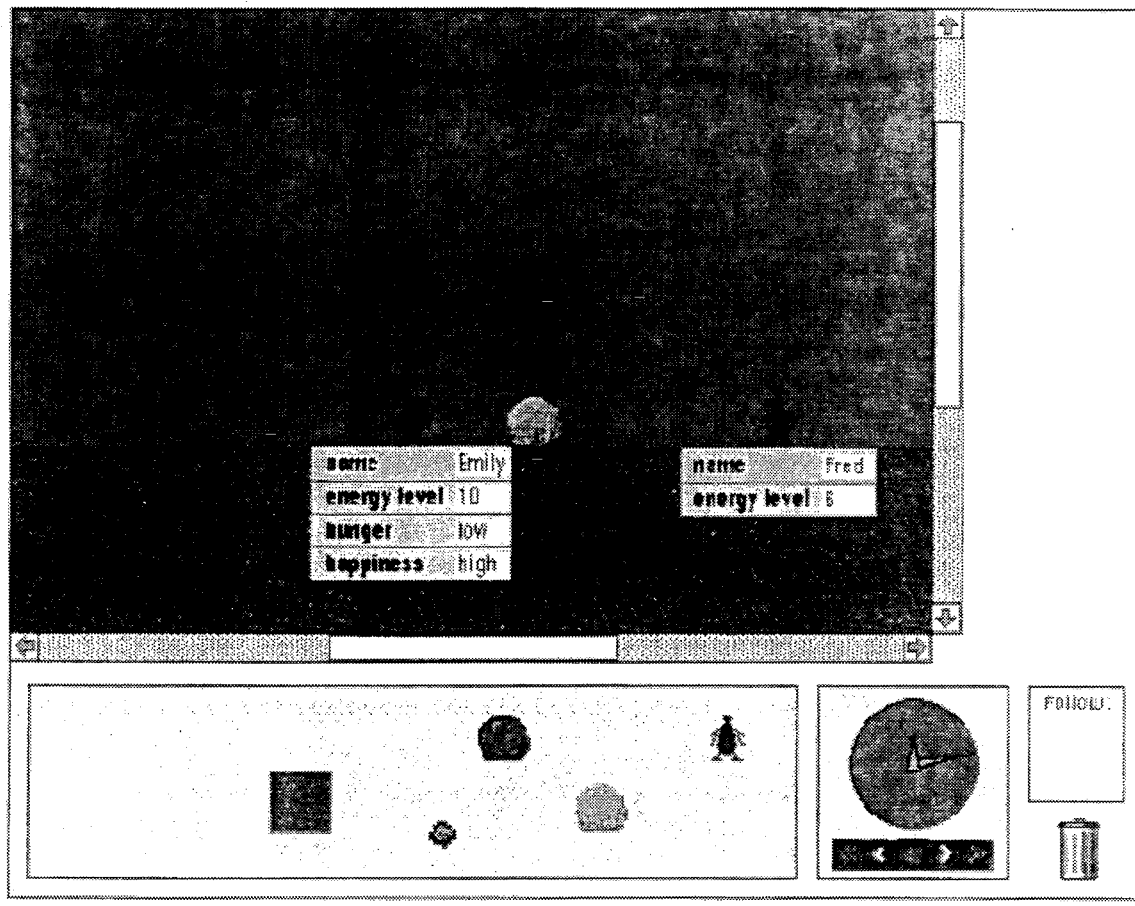

For each object in a given GRR's "before" portion, other than the object to which the GRR corresponds, the abstractor 40 enables the user to abstract or modify the hierarchical object classifications that must be satisfied for the GRR to match. This is referred to as picture abstraction. In picture abstraction, the abstractor 40 allows the user to alter a given object's hierarchical classification according to object name, object type, or any supertype within the set of user-defined supertypes that is hierarchically related to the object's type. The abstractor 40 generates and displays a type hierarchy menu 80 within the GRR editor window 70 that allows the user to perform picture abstraction. Referring now to FIG. 5A, a block diagram of a preferred embodiment of a type hierarchy menu 80 within the GRR editor window 70 is shown. The type hierarchy menu 80 is also shown in FIG. 13G, within the GRR editor window 70. The type hierarchy menu 80 is associated with a user-selected object in a given GRR's "before" portion, other than the object to which the GRR corresponds. The type hierarchy menu 80 provides the user with a list showing the selected object's name, type, and related supertypes. The list is preferably arranged from the most general supertype to successively more specific supertypes, then the object's type and finally the object's name. In the preferred embodiment, the picture of the object shown in the GRR's "before" portion is changed according to the manner in which the user alters the object's hierarchical classification. For example, if the object's hierarchical classification is generalized, a generalized picture of the object is shown in the GRR's "before" portion. This provides the user with pictorial feedback that increases the user's understanding of when the GRR can match a simulation state. In the type hierarchy menu of FIG. 5A and FIG. 13G, the user can select whether object $O_2$ or grey rock #76, respectively, will be tested for a match according to "grey rock #76", "grey rock", "rock", or whether any object will match. In the preferred embodiment, the type hierarchy menu 80 is a "pop-up" menu that appears when the user selects an object for picture abstraction.

The abstraction capabilities of the present invention are particularly advantageous because a single abstracted GRR can match multiple simulation states. This greatly reduces the number of rules the user must define and track. When fewer rules are defined, the user is more likely to understand which GRR was matched at a given stage in the simulation. This in turn improves the user's understanding of objects' actions in the simulation, and enhances the simulation's flexibility and ease of use.

The GRR editor 36 allows the user to define and modify the set of property conditions that must be satisfied for the GRR to match a simulation state. Each property condition can include one or more properties of the objects in the GRR's "before" portion. In the preferred embodiment, each property condition establishes a relationship between a property value of a specified object in the GRR's "before" portion and an expression. The expression can include one or more properties of any object in the GRR's "before" portion, including the object to which the GRR corresponds; one or more constants; and one or more operators. The operators can include mathematical operators, Boolean operators, string operators, and existence operators.

Figure 5B:
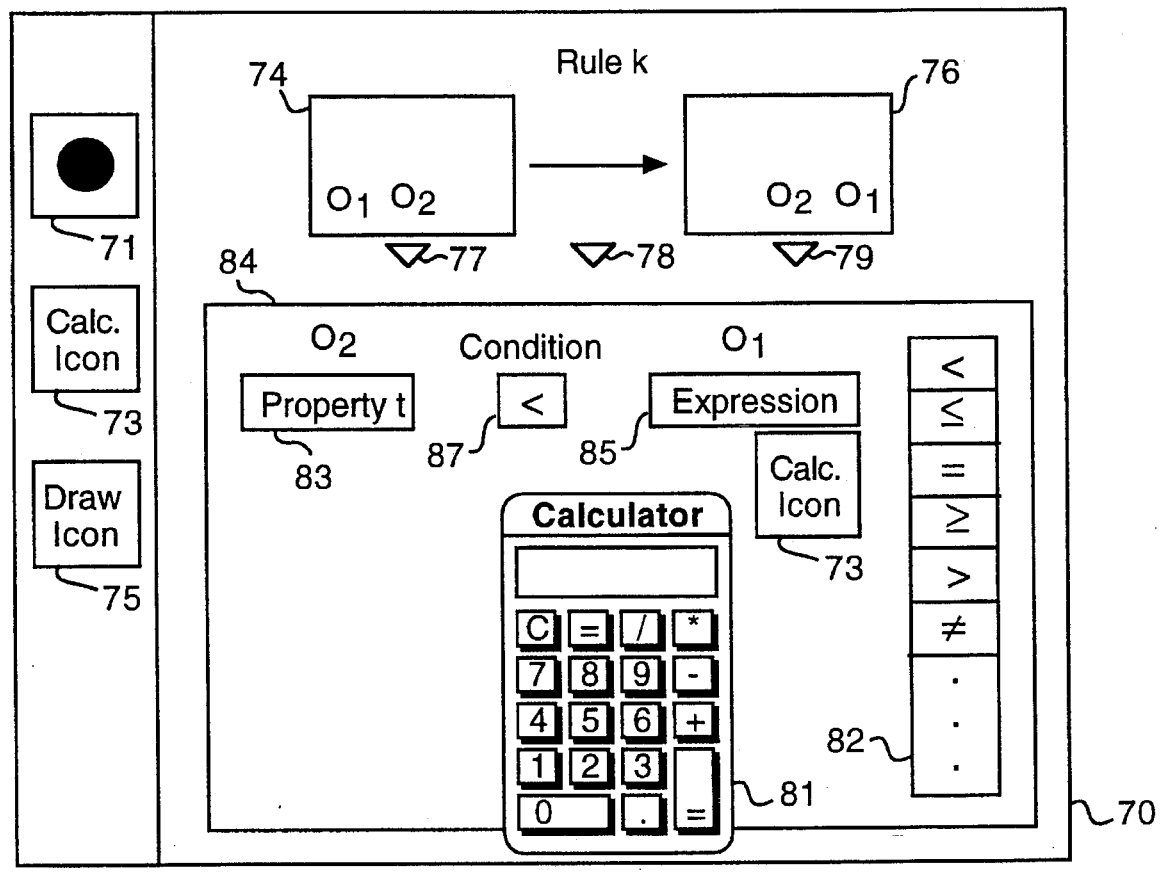

Property condition definition and editing is facilitated by a property condition window 84, a condition menu 82, a calculator window 81, a left-side box 83, a right-side box 85, a condition box 87, and a calculator icon 73 as shown in FIG. 5B. Each of these is generated and displayed in the GRR editor window 70 by the GRR editor 36. The property condition window 84 allows the user to specify a property of a particular object; a condition selected from the condition menu 82; and an expression as described above. The condition is preferably a mathematical relational operator such as "greater than," "greater than or equal to," "equal to," "less than or equal to," "less than," and "not equal to"; a Boolean operator such as "AND," "OR," or "NOT"; a relational string operator such as "contained in"; or an existence operator.

The GRR editor 36 ensures that the selected object's property value, the conditions available to the user, the operators available to the user, and the contents of the expression defined in the property condition maintain combinational and operational consistency. For example, the GRR editor 36 does not allow the user to add a floating point constant to a text value, or to operate upon a text value with a Boolean operator. The GRR editor 36 thus preferably provides the user with choices for conditions and operators based upon the property the user specifies for the selected object.

The specified property can appear in either the left-side box 83 or the right-side box 85, and the selected condition appears in the condition box 87. In the preferred embodiment, the user places the specified property into either the left-side box 83 or the right-side box 85 by dragging the property from the property editor window 92 into the desired box. After the specified property has been dragged into the desired box, the GRR editor 36 automatically places an "equals" operator in the condition box 87, and shows the current value of the specified property in the other box. The specified property, the equals operator, and the current value of the specified property serve to establish a default property condition, where the current value of the specified property is the initial expression. After the default property condition has been established, it can be modified by the user. The calculator window 81 provides the user with calculator functions during expression definition or modification. In the preferred embodiment, the calculator window 81 is displayed when the user selects the calculator icon 73. If the user has used calculator functions during expression editing, another instance of the calculator icon 73 is also displayed below the box containing the expression, as shown in FIG. 5B. In the preferred embodiment, the user initiates and terminates property condition definition or editing by selecting the property condition button 77 displayed in the GRR editor window 70. Once the user has completed property condition definition or editing, the abstractor 40 generalizes the property condition, and then stores the property condition in RAM 22.

The simulation execution controller 50 controls the execution of a simulation, and allows the user to interrupt simulation execution to perform simulation programming activities. The simulation execution controller 50 generates and displays an execution control window 56 as shown in FIGS. 3A, 3B, and 3C that allows the user to selectively control simulation execution. During the execution of a simulation, the simulation execution controller 50 sequentially tests Graphical Rewrite Rules in each object's GRR set for a match with a simulation state. For the first match detected in a given object's GRR set, the simulation execution controller 50 executes the GRR program for the matching GRR that the user has previously defined through programming by demonstration. This in turn results in the movement of one or more objects in the simulation state, the modification of one or more object properties, or both. When an object is to move from one simulation grid element to another, the simulation execution controller 50 updates the object location list stored in RAM. When a match occurs in a portion of the simulation that is currently displayed as a scene in the simulation viewer window 54, the simulation viewer 34 redisplays the scene and each object within the scene as the object location list is updated. In this manner, the user can visually follow the behavior of each object in the displayed scene. After GRR program execution has been completed, the updated portion of the simulation corresponds to the matching GRR's "after" portion.

In the preferred embodiment, the simulation execution controller 50 sequentially tests the Graphical Rewrite Rules in a given object's GRR set only until a matching GRR has been found or until each GRR in the object's GRR set has been tested. Within each GRR set, Graphical Rewrite Rules are preferably ordered in a first-to-last user-defined sequence. The simulation execution controller 50 selects each GRR for testing according to this sequence. Once the simulation execution controller 50 finds the first matching GRR, any remaining Graphical Rewrite Rules in the object's GRR set are not tested for a match. Rather, after execution of the GRR program corresponding to the matching GRR, the simulation execution controller 50 proceeds to test the Graphical Rewrite Rules in another object's GRR set.

For an object having one or more Graphical Rewrite Rules in its GRR set, the simulation execution controller 50 retrieves a first GRR from RAM 22. The GRR's "before" portion includes the set of hierarchical object classifications and the set of property conditions that were defined during GRR creation or during abstraction. The simulation execution controller 50 first tests the GRR for a match according to any picture abstraction that has been defined. If the objects and the simulation grid elements corresponding to the GRR match a simulation state according to any picture abstractions, the GRR is next tested for a match according to property abstractions. In the testing according to property abstractions, the simulation execution controller 50 sequentially tests each property condition in the GRR's property condition set. For each property condition, the simulation execution controller 50 calculates the value of its expression, and then compares the property specified in the property condition against the value of the expression according to the selected condition. If all comparisons are true according to each condition indicated in the set of property conditions, the GRR program is executed.

Through the execution control menu 56, the simulation execution controller 50 provides the simulation user with a means for controlling the sequential execution of a simulation and a means for viewing the current execution status of the simulation. The execution control menu 56 comprises a simulation clock window 58, a stop button 60, a single step forward button 62, a repeated step forward button 64, a single step reverse button 66, and a repeated step reverse button 68. The simulation execution controller 50 maintains an internal simulation timer that is incremented as the simulation is sequentially executed. The state of the simulation timer and therefore the current execution state of the simulation is indicated by the simulation clock window 58.

The simulation execution controller 50 sequentially executes a simulation as follows: 1) the simulation execution controller 50 increments the simulation timer and updates the simulation clock window 58; 2) for each object in the simulation, Graphical Rewrite Rules in the object's GRR set are sequentially tested for matches; and 3) for the first matching GRR in each object's rule list, the corresponding GRR program is executed, causing the simulation viewer window 54 to be updated. If the user selects the repeated step forward button 64, steps 1 through 3 are successively repeated for forward time progression until the user selects the stop button 60. If the user selects the single step forward button 62, steps 1 through 3 above are performed only once for forward time progression.

The execution of a GRR program results in a set of actions being performed by or upon one or more objects. In the preferred embodiment, the user can initiate one or more actions during a simulation's execution by interacting with the simulation in a predetermined number of ways. For example, the user can add an object to the simulation. This causes the simulation execution controller 50 to perform a "stop" action, followed by an "add object" action, followed by a "resume" action. Similarly, the user can delete an object from the simulation, giving rise to a "stop" action, a "delete object" action, and a "resume" action. Each predetermined user interaction causes the simulation execution controller 50 to increment the simulation timer prior to performing the actions associated with the interaction.

When a given action is performed by or upon an object, the state of the object changes. In the preferred embodiment, for each possible type of action the user can define through programming by demonstration during GRR definition, a corresponding "undo" action exists. If a given action and its corresponding "undo" action are successively performed, the "undo" action returns the object to the state it was in prior to the performance of the given action.

For each increment of the simulation timer, the simulation execution controller 50 stores in an action list an account of each action that has been performed and the object to which it corresponds. In the preferred embodiment, the action list is stored in RAM 22. Through the single step backward button 66, the simulation execution controller 50 enables the user to sequentially reverse or "undo" those actions that had been performed during the previous simulation timer increment. When the user selects the single step backward button 66, the simulation execution controller 50 first decrements the simulation timer. The simulation execution controller 50 then sequentially executes in reverse order the "undo" action corresponding to each action that was entered in the action list for the current simulation timer value. If the user selects the repeated step backward button 68, the simulation execution controller 50 repeats the steps described above until the user selects the stop button 60. In this manner, the simulation execution controller 50 allows the user to run a simulation backwards to any desired point up to the beginning of execution.

When the user has selected the stop button 60, the simulation execution controller 50 completes the current simulation execution cycle. Following its completion, the user can perform functions related to GRR definition, editing, and abstraction; perform property editing functions; and manually change the set of objects in the simulation through object insertion, object deletion, and placement of objects in the time-out region 55. In addition, the user can continue simulation execution by selecting either the single step forward button 62 or the repeated step forward button 64; or reverse the simulation by selecting the single step backward button 66 or the repeated step backward button 68.

The GRR editor 36 generates and displays a buttons icon 49 as shown in FIGS. 3A, 3B, and 3C, and in FIGS. 13A, B & C. When simulation execution has been interrupted and the user selects the buttons icon 49, the GRR editor 36 displays on a buttons page one or more rule testing buttons (not shown). The GRR editor 36 enables the user to define Graphical Rewrite Rules for each rule testing button. Thus, each rule testing button has its own set of Graphical Rewrite Rules. If the user selects a given rule testing button during simulation execution, the simulation execution controller 50 tests only those Graphical Rewrite Rules corresponding in the rule testing button's GRR set following the next simulation timer increment, rather than testing Graphical Rewrite Rules for each object in the simulation.

In the preferred embodiment, a simulation may be defined to have a number of simulation grid elements that span an area that is larger than the simulation viewer window 54. An object can therefore move beyond one of the simulation viewer window's boundaries and out of the user's view. The simulation viewer 34 generates and displays the object follower window 96 to allow the user to continuously track or follow a selected object during simulation execution, thereby ensuring that the selected object is displayed in the simulation viewer window 54 throughout the simulation's execution. In the preferred embodiment, the user indicates that an object is to be followed by moving or "dragging" the object from the simulation viewer window 52 into the object follower window 96.

Figure 6:
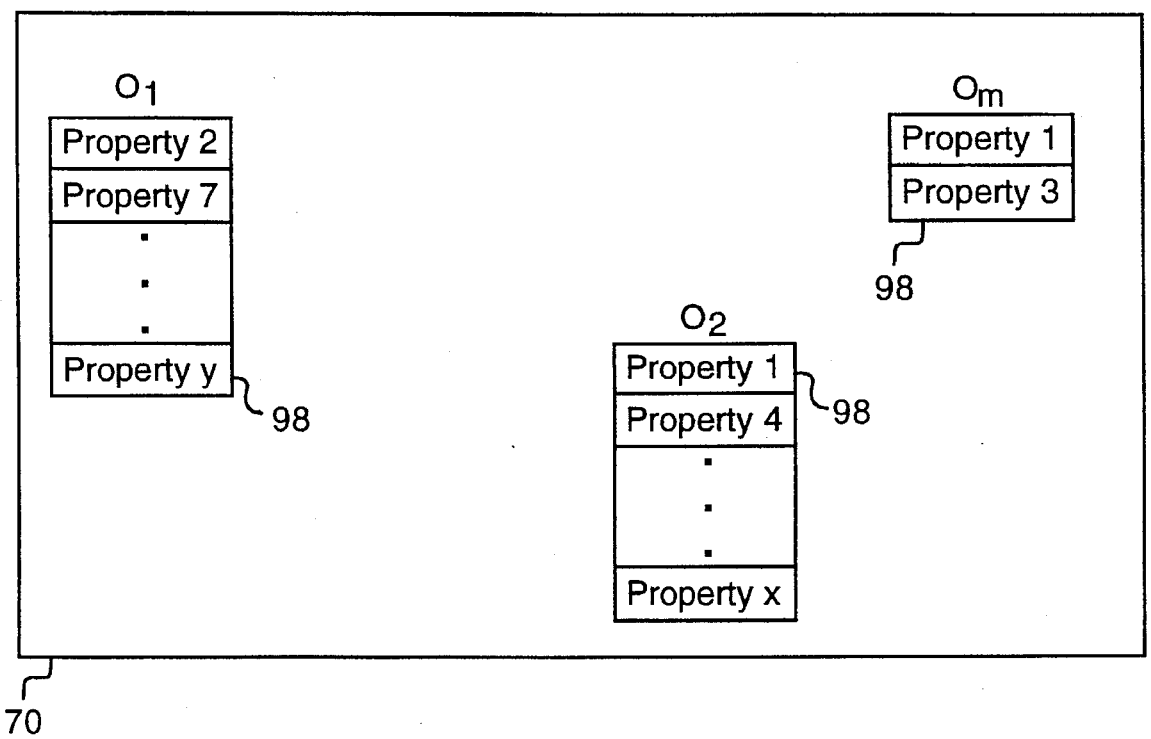
FIG. 6 illustrates a preferred embodiment of a heads-up object property display of the present invention.

During the execution of a simulation, one or more properties of a given object may be updated. The simulation viewer 34 advantageously provides the user with a heads-up object property display 98 for tracking selected properties associated with one or more objects located within the scene displayed in the simulation viewer window 54. Referring now to FIG. 6, a preferred embodiment of a heads-up object property display 98 is shown. The heads-up object property display 98 comprises a pull-down graphical window containing a list of user-selected properties associated with a user-selected object. The heads-up object property display 98 allows the user to monitor the selected properties of each selected object that is present in the currently-displayed scene. The heads-up object property display 98 is particularly advantageous because its position is modified on the output device 16 with each of the object's movements such that the heads-up object property display 98 effectively follows or is attached to the object. This in turn provides the user with a better understanding of actions occurring within the simulation.

While the elements of the extensible simulator 30 have been described as performing actions, those skilled in the art will recognize that each element preferably comprises computer program steps for controlling the CPU 12.

Figure 7:
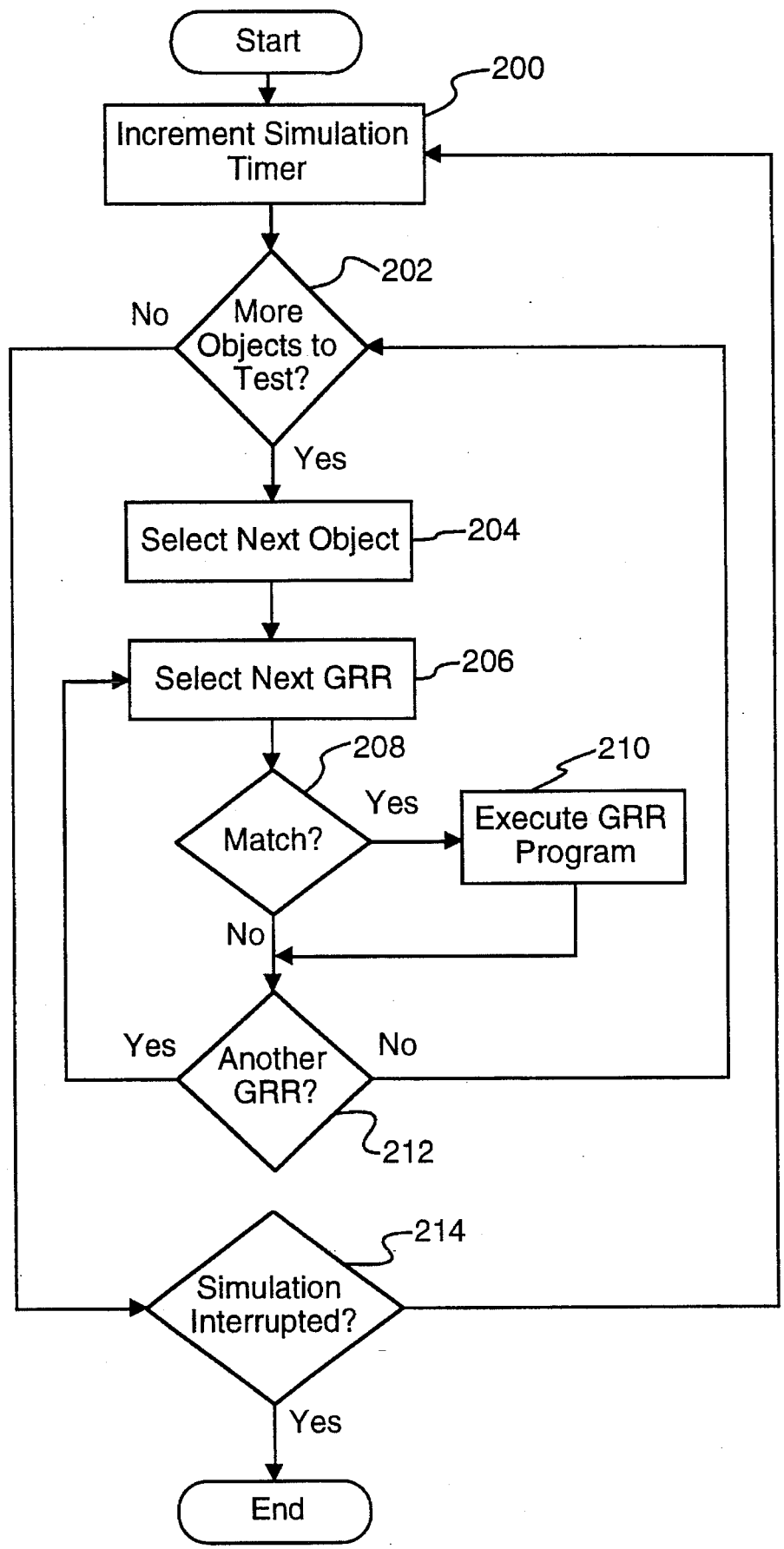
FIG. 7 is a flowchart showing a preferred simulation execution method of the present invention.

Referring now to FIG. 7, a flowchart of the preferred method for simulation execution is shown. The preferred method begins in step 200 with the simulation execution controller 50 incrementing the simulation timer. Next, in step 202, the simulation execution controller 50 determines whether additional objects in the simulation are to be tested for matches to a current simulation state. In the preferred embodiment, only those objects having Graphical Rewrite Rules in their corresponding GRR sets are tested. Within each simulation timer increment, all objects having Graphical Rewrite Rules in their GRR sets are tested once. If in step 202 the simulation execution controller 50 determines that at least one additional object having Graphical Rewrite Rules in its GRR set remains to be tested during the current simulation timer increment, the simulation execution controller 50 selects a next object in step 204. Following step 204, the simulation execution controller 50 selects a next GRR in step 206. Within the selected object's GRR set, Graphical Rewrite Rules are preferably ordered from first-to-last in a user-defined sequence. Selection of each GRR proceeds according to this first-to-last ordering. After step 206, the simulation execution controller 50 determines if the selected GRR matches a current simulation state. A match to a current simulation state is defined as described above. If a match exists, the simulation execution controller 50 executes the corresponding GRR program in step 210.

Following step 210, or step 208 if the simulation execution controller 50 determines that the selected GRR does not match a current simulation state, the preferred method determines in step 212 if another GRR in the selected object's GRR set requires testing. If so, the preferred method proceeds to step 206. If no Graphical Rewrite Rules in the selected object's GRR set require testing, the preferred method returns to step 202.

If in step 202 the simulation execution controller 50 determines that no additional objects require testing, the simulation execution controller 50 determines in step 214 whether the user has interrupted the simulation. In the preferred embodiment, simulation interruption occurs when the user selects the stop button 60. If the simulation has not been interrupted, the preferred method proceeds to step 200 to continue the execution of the simulation. If the simulation has been interrupted, the preferred method ends.

Figure 8:
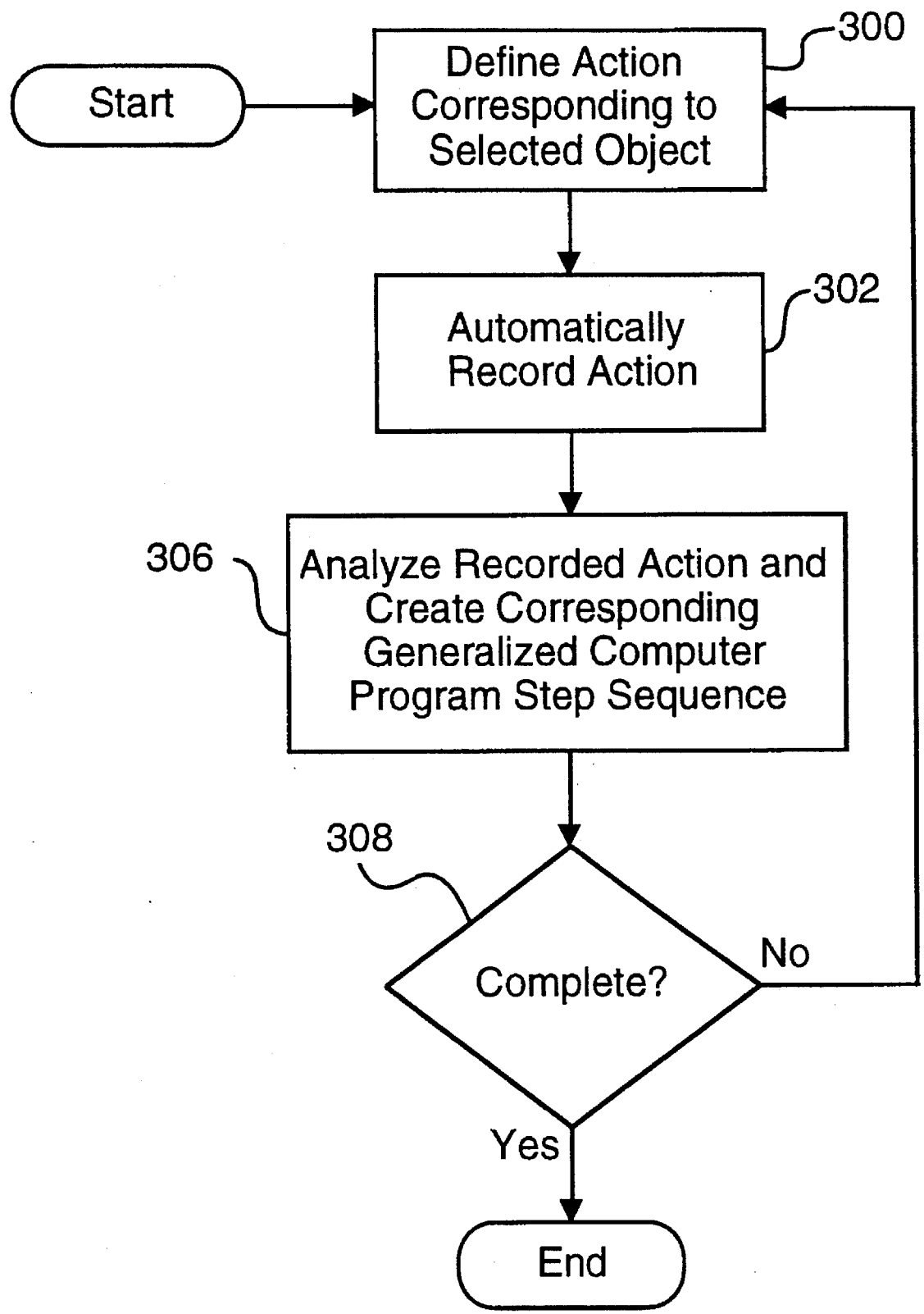
FIG. 8 is a flowchart of a preferred method for programming by demonstration in the present invention.

Referring now to FIG. 8, a flowchart of a preferred method for programming by demonstration in the present invention is shown. The preferred method begins in step 300 with the user demonstrating or defining an action corresponding to an object shown in a GRR's "before" portion. Next, in step 302, the action recorder 38 automatically records the demonstrated action as a portion of a recording. The abstractor 40 then analyzes the recorded action, and creates a corresponding generalized computer program step sequence in step 306. Following step 306, the action recorder 38 determines whether the user has completed programming by definition. If not, the preferred method returns to step 300. If programming by definition has been completed, the preferred method ends.

Figure 9A:
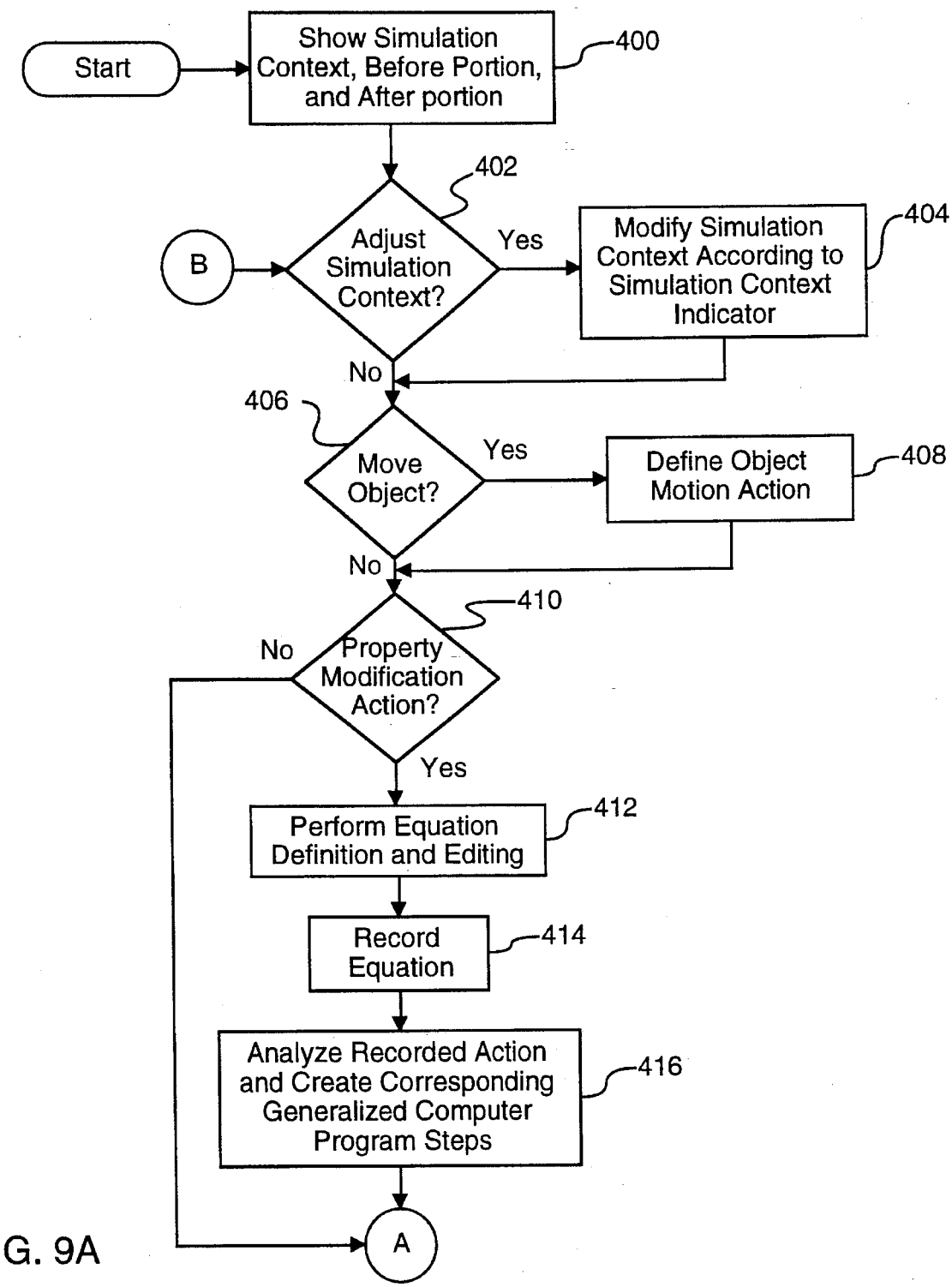
FIGS. 9A and 9B are a flowchart of a preferred graphical programming method in accordance with the present invention.
Figure 9B:
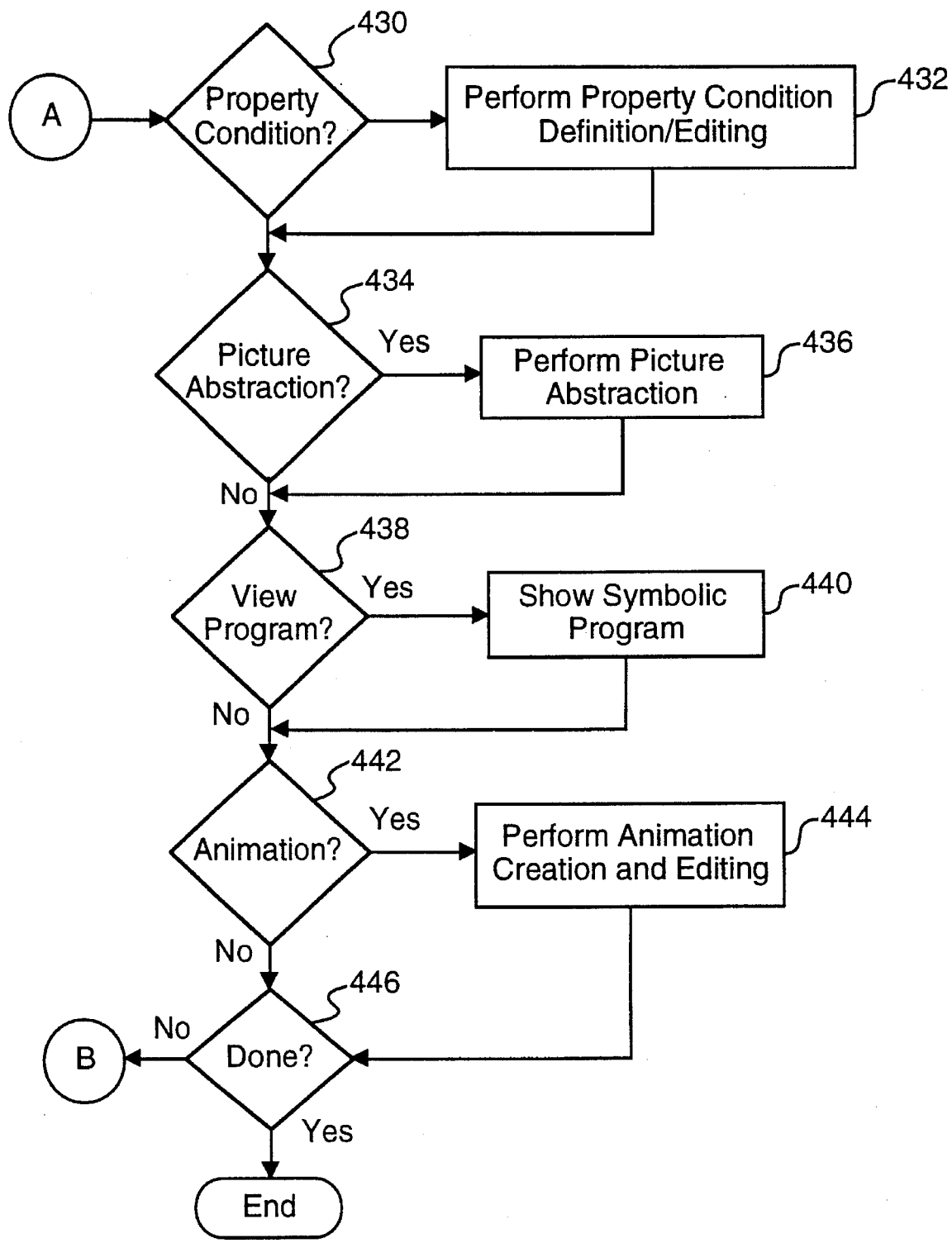

Referring now to FIGS. 9A and 9B, a flowchart of a preferred graphical programming method in accordance with the present invention is shown. The preferred method begins in step 400 with the GRR editor 36 and the simulation viewer 34 showing the simulation context, the "before" portion, and the "after" portion corresponding to a GRR in step 400. When a GRR is initially defined, its simulation context, its "before" portion, and its "after" portion show the object to which the GRR corresponds and the simulation grid elements the object occupies. Next, in step 402, the GRR editor 36 determines whether the simulation context has been adjusted. Preferably, the user adjusts the simulation context by positioning the simulation context indicator 72 in the simulation viewer window 54. If in step 402 the GRR editor 36 determines that the user has adjusted the simulation context, the GRR editor 36 sets the simulation context to the subset of simulation grid elements surrounded by the simulation context indicator 72, the selected object, and any additional objects contained therein in step 404. In step 404, the GRR editor 36 also includes in the simulation context information specifying object occupancies in the subset of simulation grid elements, the set of hierarchical object classifications, and the set of property conditions. After step 404, or if the GRR editor 36 determines in step 402 that the simulation context has not been adjusted, the GRR editor 36 determines whether an object in the GRR's "before" portion or in the simulation viewer 54 has been moved in step 406. If so, the action recorder 38 and the abstractor 40 define an object motion action in step 408. If the GRR editor 36 determines that an object has not moved in step 406, or following step 408, the GRR editor 36 determines whether a property modification action is to be defined or edited in step 410. Preferably, the user indicates that a property modification action is to be defined or edited by selecting the property modification button 79. If a property modification action is to be defined or edited, the GRR editor 36 performs equation definition and editing in step 412. Following step 412, the action recorder 38 records the equation as a portion of a recording in step 414. Next, in step 416, the abstractor 40 analyzes the recorded equation and creates a corresponding generalized computer program step sequence that can implement the required property modification action.

After step 416, or following step 410 if the GRR editor 36 determines that no property modification action is to be defined or edited, the GRR editor 36 determines whether property condition definition or editing is required in step 430. If so, the GRR editor 36 performs property condition definition or editing in step 432. If in step 430 the GRR editor 36 determines that property condition definition or editing is not required, or after step 432, the GRR editor 36 determines whether picture abstraction is required in step 434. Preferably, the user indicates that picture abstraction is required by selecting an object shown in the GRR's "before" portion. If picture abstraction is required, the abstractor 40 performs the necessary picture abstraction in step 436.

If the GRR editor 36 determines in step 434 that picture abstraction is not required, or following step 436, the GRR editor 36 determines whether the GRR program is to be shown. The user preferably indicates that the GRR program is to be shown by selecting the view program button 78. If the GRR program is to be shown, the GRR editor 36 shows the symbolic program steps corresponding to the GRR program in step 440.

After step 440, or after step 438 if the GRR program is not to be shown, the GRR editor 36 determines whether an animation is to be defined or edited. Preferably, the user indicates that an animation is to be defined or edited by selecting the drawing editor icon 75 from within the GRR editor window 70. If the GRR editor 36 determines in step 442 that an animation is to be defined or edited, the drawing editor 42 performs the animation definition or editing in step 444.

If the GRR editor 36 determines that no animation is to be defined or edited in step 442, or after step 444, the GRR editor 36 determines in step 446 whether graphical programming is complete. In the preferred method, the user indicates that graphical programming is complete by selecting the completion button 71. If graphical programming is to continue, the preferred method returns to step 402. If graphical programming is complete, the preferred method ends.

Figure 10:
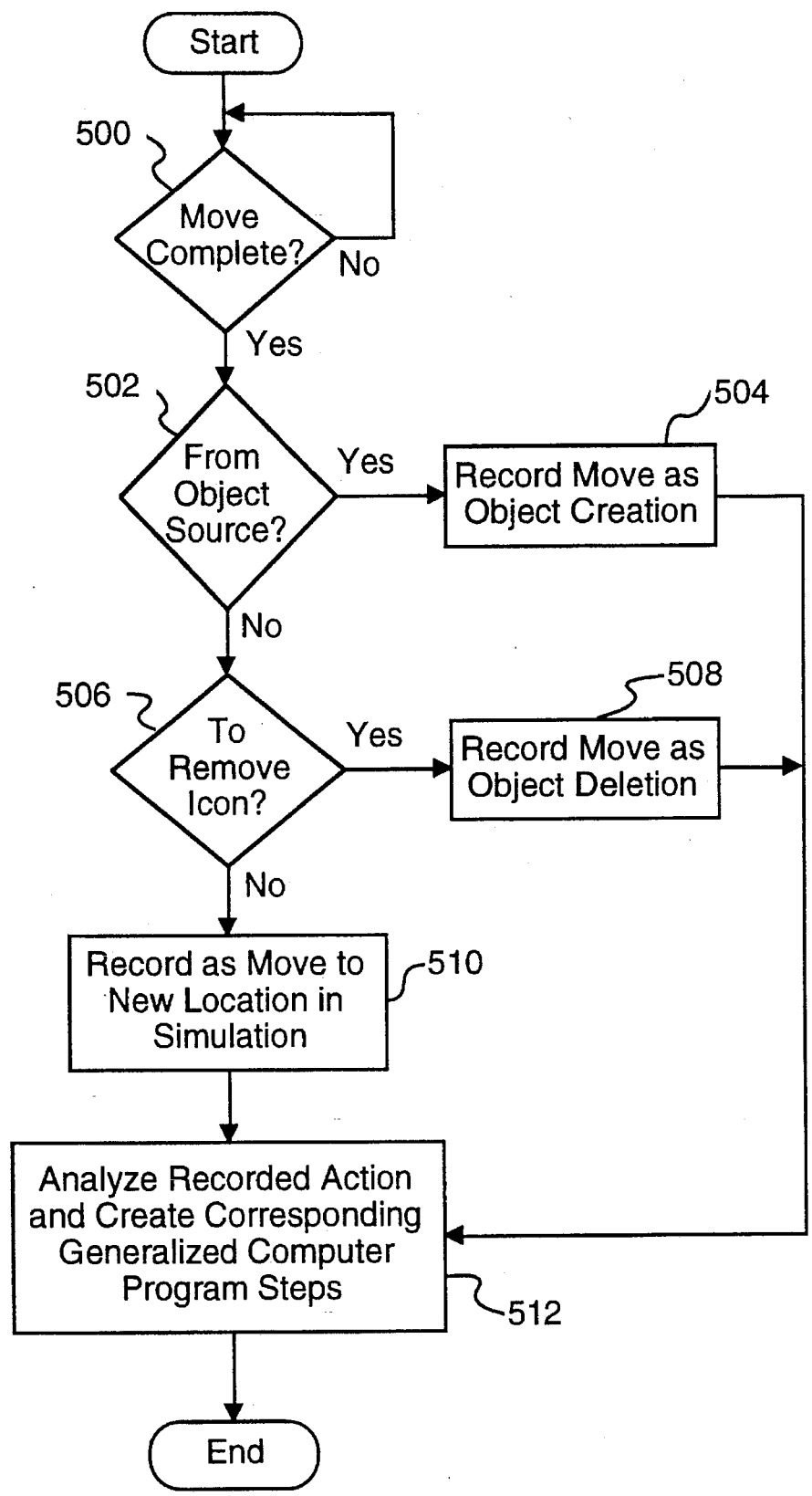
FIG. 10 is a flowchart of a preferred method for defining an object motion action in the present invention.

Referring now to FIG. 10, a flowchart of a preferred method for defining an object motion action (step 408 of FIGS. 9A and 9B) is shown. The preferred method begins in step 500 with the action recorder 36 determining whether the object motion has been completed. Preferably, object motion is completed after the user has deselected the object. If the object motion has not been completed, the preferred method remains in step 500. Once the object motion has been completed, the action recorder 36 determines whether the object has been moved from the object source to the GRR's "before" portion or to the simulation viewer window 154 in step 502. If the object has been moved in this manner, the action recorder 38 records the action as an object creation in step 504. If the action recorder 38 determines that the object has not been moved from the object source in step 502, the action recorder 38 determines whether the object has been moved to the remove icon 97 in step 506. If so, the action recorder 38 records the action as an object deletion in step 508. If the action recorder 38 determines in step 506 that the object was not moved to the remove icon 97, the action recorder 38 records the action as a move from a first simulation grid element to a second simulation grid element in step 510. After step 504, step 508, or step 510, the abstractor 40 analyzes the recorded action and creates a corresponding generalized computer program step sequence that can carry out the desired object motion action in step 512. Following step 512, the preferred method ends.

Figure 11A:
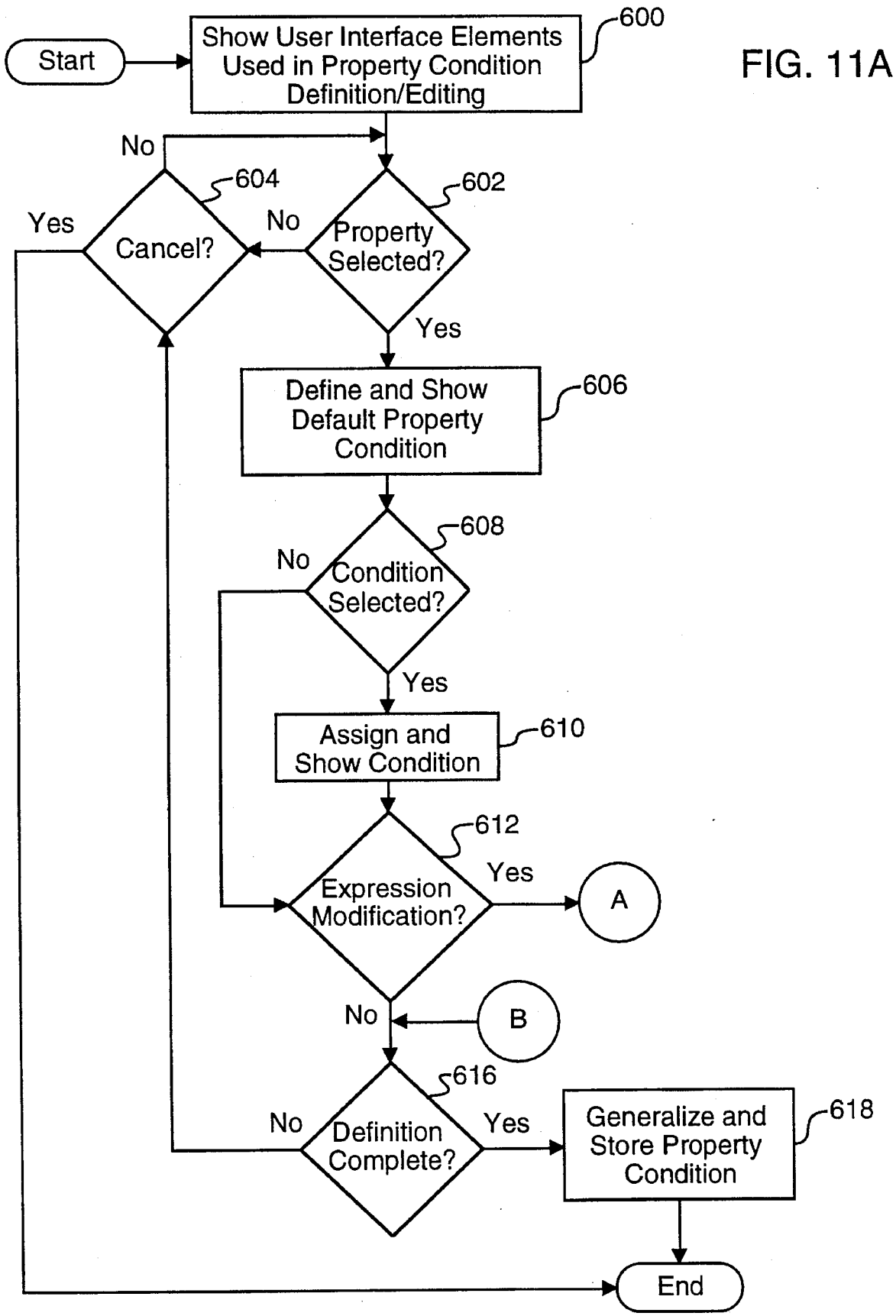
FIGS. 11A and 11B are a flowchart of a preferred method for defining or editing a property condition in the present invention.
Figure 11B:
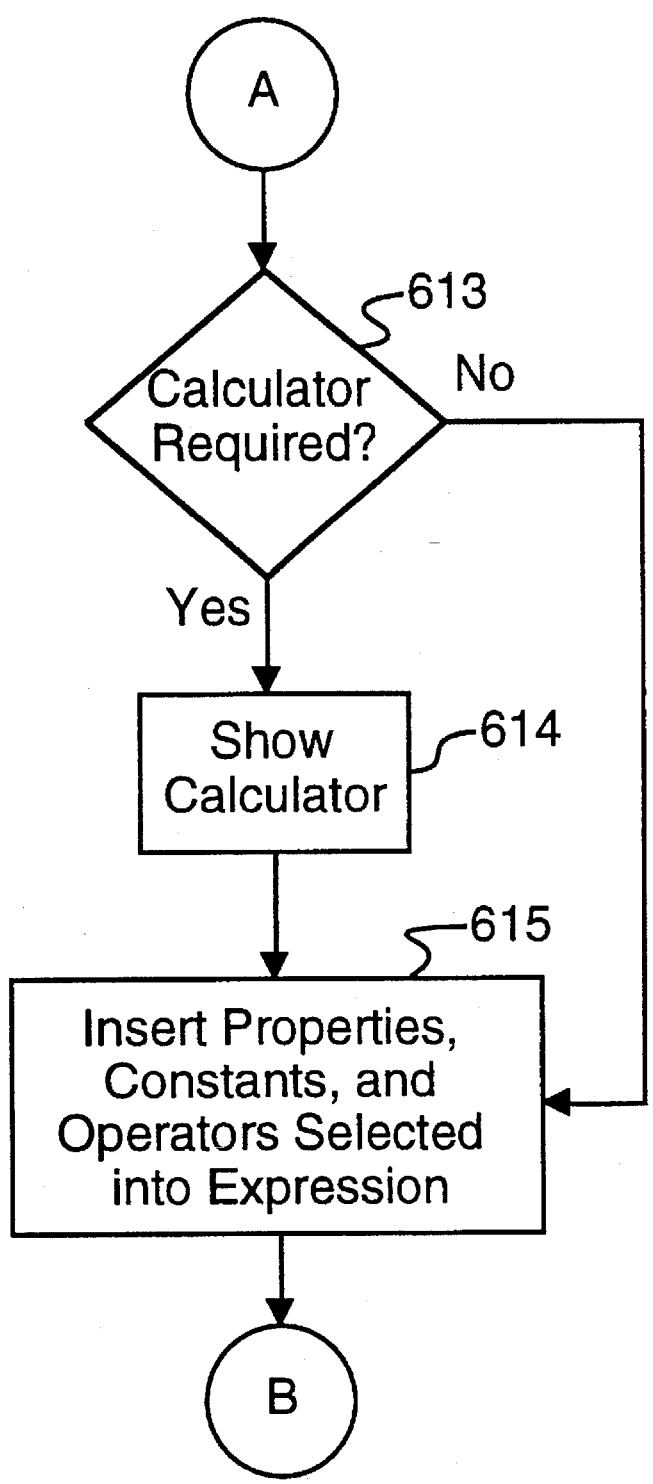

Referring now to FIGS. 11A and 11B, a flowchart of a preferred method for defining or editing a property condition in the present invention is shown. The preferred method begins in step 600 with the GRR editor 36 displaying the user interface elements that are used in property condition definition or editing. These preferably include the property condition window 84, the condition menu 82, the calculator window 81, the left-side box 83, the right-side box 815, the condition box 87, and the calculator icon 73. In addition, the calculator window 81 is selectively displayed as described below. The GRR editor 36 then determines in step 602 whether the user has selected a property. In the preferred embodiment, the user selects a property by dragging a given object's property that is displayed in the property editor window 92 into either the left-side box 83 or the right-side box 85. If the user has not selected a property, the GRR editor 36 determines whether property condition definition or editing is to be canceled in step 604. If property condition definition or editing is to be canceled, the preferred method ends. In the preferred embodiment, the user indicates cancellation of property condition definition or editing by selecting a cancellation button. If property condition definition or editing is to continue, the preferred method returns to step 602.

If the GRR editor 36 determines in step 602 that the user has selected a property, the GRR editor 36 defines and shows the default property condition in step 606. In the preferred embodiment, the selected property, an equals condition, and the current value of the selected property form the default property condition. The current value of the selected property is initially the property condition's expression. Following step 606, the GRR editor 36 determines in step 608 if the user has selected a condition from the condition menu 82. If so, the GRR editor 36 assigns the selected condition to the property condition in step 630. After step 630, or if the GRR editor 36 determines that the user has not selected a condition in step 608, the GRR editor 36 determines whether the user has begun modification of the expression in step 612. If so, the GRR editor 36 determines whether the user requires calculator functions in step 613. Preferably, the user indicates that calculator functions are required by selecting the calculator icon 73. If the GRR editor 36 determines in step 613 that the user requires calculator functions, the GRR editor 36 displays the calculator window 81 in step 614. After step 614, or if the GRR editor 36 determines in step 613 that the user does not require calculator functions, the GRR editor 36 inserts any properties, constants, or operators into the expression in step 615 as they are selected or input by the user. Following step 615, or if the GRR editor 36 determines in step 612 that the user is not modifying the expression, the GRR editor 36 determines in step 616 if definition or editing of the property condition is complete. If so, the abstractor 40 generalizes the property condition, and then stores the property condition in RAM 22 in the property condition set associated with the GRR in step 618. After step 618, the preferred method ends. If the GRR editor 36 determines that the property condition definition is not complete in step 616, the preferred method returns to step 604.

Figure 12:
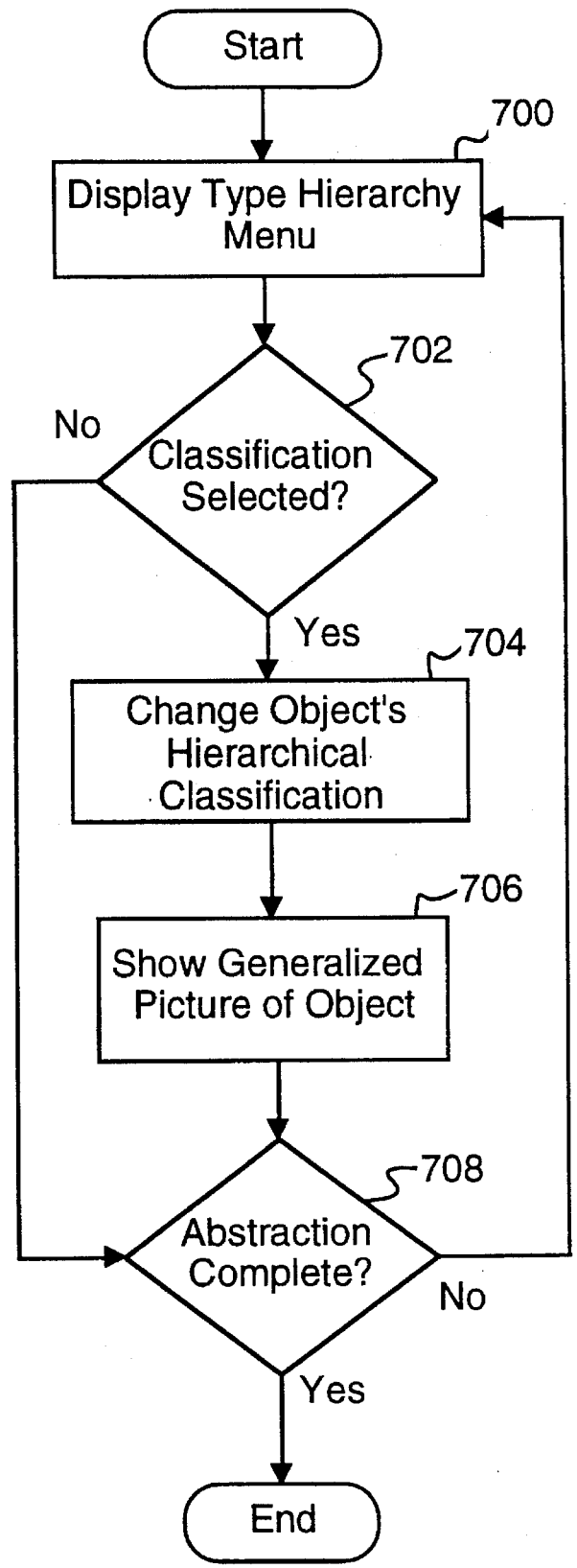
FIG. 12 is a flowchart of a preferred method for performing picture abstraction in the present invention.

Referring now to FIG. 12, a flowchart of a preferred method for performing picture abstraction (step 436 of FIG. 9) in the present invention is shown. The preferred method begins in step 700 with the abstractor 40 generating and displaying the type hierarchy menu 80 corresponding to the selected object. The type hierarchy menu 80 preferably shows each user-defined supertype that applies to the selected object, the selected object's type, and the selected object's name arranged in a most-general to most-specific order. In the preferred embodiment, the abstractor 40 implements the type hierarchy menu 80 as a "pop-up" menu. The abstractor 40 then determines if the user has selected a hierarchical classification from the type hierarchy menu 80 in step 702. If the user selects a hierarchical classification, the abstractor 40 changes the object's hierarchical classification by adding the selected classification to the GRR's hierarchical classification set in step 704. When the GRR is tested for a match, the selected object and a corresponding object within a simulation state are tested to determine whether they are hierarchically related according to the selected hierarchical classification. Following step 704, the abstractor 40 alters the object's picture in the GRR's "before" portion in step 706, according to the hierarchical object classification the user has selected. If a more general hierarchical classification has been selected, the object's picture in the GRR's "before" portion is generalized accordingly. Next, in step 708, the abstractor 40 determines if picture abstraction is complete. If picture abstraction is not complete, the preferred method returns to step 700. If the abstractor 40 determines that picture abstraction is complete in step 708, the preferred method ends. Preferably, the user indicates that picture abstraction is complete by deselecting the selected object.

While the present invention has been described with reference to certain preferred embodiments, those skilled in the art will recognize that various modifications may be provided. Variations upon and modifications to the preferred embodiments are provided for by the present invention, which is limited only by the following claims.

What is claimed is:

1. A computerized extensible simulation system providing an easy to use and interactive environment for creating and executing a computer simulation, said system comprising:

an output device for displaying data and graphical images, the output device having an input;

an input device for sending data and commands into the system, the input device having an output;

a memory having inputs and outputs for storing data and commands, the memory having an object source comprised of program instructions for generating a plurality of graphic objects, an abstractor comprised of program instructions for generating a graphical rewrite rule in response to a graphical manipulation of a graphic object upon the output device via the input device wherein the graphical rewrite rule comprises program instructions defining a manner in which the graphic object is to be selectively manipulated upon the output device, a simulation viewer comprised of program instructions for controlling the display of the graphic objects and their actions on the output device, a graphical rewrite rule editor comprised of program instructions for allowing the graphical definition of properties and graphical rewrite rules for the graphic objects, a simulation controller comprised of program instructions for executing the graphical rewrite rule to produce the graphic object's actions; and a processing unit having an input and output for processing data and generating images on the output device under the control of the memory, the output of the processing unit coupled to the input of the output device, the input of the processing unit coupled to the output of the input device, and the input and output of the processing unit coupled to the memory.

2. The computerized extensible simulation system of claim 1, wherein at least one of the plurality of graphic objects has an associated graphical representation, a type, a unique name, a set of properties, and a set of graphical rewrite rules.

3. The computerized extensible simulation system of claim 1, wherein the simulation viewer maintains a simulation as a set of simulation grid elements having predetermined graphical characteristics, and the simulation viewer controls the processing unit to display scenes of the simulation as one or more grid elements in a simulation viewer window along with graphical representations of graphic objects in the set of simulation grid elements, wherein a simulation grid element comprises a displayable portion of the simulation.

4. The computerized extensible simulation system of claim 3, wherein the simulation viewer also controls the outputting of a graphic object property display, the graphic object property display showing on the output device current properties of a graphic object and positioned at a predefined position with respect to the graphic object.

5. The computerized extensible simulation system of claim 3, wherein the graphical rewrite rule editor controls the processing unit to display an editor window, a graphic object, and a simulation context on the output device, and includes an action recorder for receiving actions input by a user of the graphic object in the simulation context displayed in the editor window and for translating the actions into a graphical rewrite rule executable by the simulation controller, wherein the simulation context is a subset of simulation grid elements containing a selected graphic object.

6. The computerized extensible simulation system of claim 1, wherein the memory further comprises program instructions for generating:

a graphic object source for storing the plurality of graphic objects, for maintaining at least one type for each graphic object, for maintaining a hierarchical relationship between graphic object types, and for maintaining a set of properties for at least one graphic object; and a graphic object abstractor for modifying the applicability of a graphical rewrite rule having a before portion including associated graphic objects, the graphic object abstractor changing the type of at least one of the associated graphic objects and adding property match conditions for use by the simulation controller during execution of the rule.

7. The computerized extensible simulation system of claim 1, wherein the simulation controller sequentially tests the graphical rewrite rules in at least one graphic object's graphical rewrite rule set for a match with a simulation context and then for the first match detected executes a Graphical Re-write Rule program corresponding to the graphical rewrite rule which matched the simulation context to produce the actions input by the user during creation of the graphical rewrite rule, wherein the simulation context is a subset of simulation grid elements containing a selected graphic object, and wherein a simulation grid element comprises a displayable portion of the simulation.

8. The computerized extensible simulation system of claim 2, wherein the memory further comprises a drawing editor comprised of program instructions for controlling the display of a drawing editor window, the drawing editor providing for modification of the graphical representation of the graphic object in the simulation and for the creation of graphical representations of the graphic object transitioning between a before and an after portion of a graphical rewrite rule.

9. The computerized extensible simulation system of claim 2, wherein the memory further comprises a graphic object property editor comprised of program instructions for controlling the display of a graphic object property editor window on the output device, and for accepting inputs via the processing unit for adding or changing the properties associated with a graphic object.

10. The computerized extensible simulation system of claim 1, wherein the memory further comprises a graphic object rule viewer comprised of program instructions for controlling the display of a graphic object rule viewer window on the output device, the graphic object rule viewer displaying a before portion and an after portion for at least one graphical rewrite rule associated with a selected graphic object.

11. A computer implemented method for executing a simulation having a plurality of graphic objects in an extensible simulation system, the method comprising the steps of:

determining a current simulation context comprising a graphical portion of a display generated upon a display device;

selecting a graphic object within the current simulation context;

determining whether there is a graphical rewrite rule having a before portion and an after portion associated with the selected graphic object, wherein the graphical rewrite rule defines a manner in which a first simulation context, matching the before portion, is to be graphically replaced with a second simulation context, matching the after portion;

selecting a graphical rewrite rule if there is a graphical rewrite rule associated with the selected object;

determining whether the before portion of the selected graphical rewrite rule matches the current simulation context for the selected graphic object; and executing a program corresponding to the selected graphical rewrite rule if the before portion of the selected graphical rewrite rule matches the current simulation context.

12. The computer implemented method of claim 11, further comprising the step of repeating the steps of selecting a graphical rewrite rule, determining whether the before portion of the selected graphical rewrite rule matches, and executing a program, for each graphical rewrite rule associated with the selected graphic object.

13. The computer implemented method of claim 11, further comprising the step of repeating the steps of selecting a graphic object, determining whether there is a graphical rewrite rule, selecting a graphical rewrite rule, determining whether the before portion of the selected graphical rewrite rule matches, and executing a program, for each graphic object in the simulation having an associated graphical rewrite rule.

14. The computer implemented method of claim 11, further comprising the steps of:

maintaining a simulation timer; and incrementing the simulation timer before the first selecting step and the second determining step are performed for the graphic objects in the simulation.

15. The computer implemented method of claim 11, wherein the step of determining whether the before portion of the selected graphical rewrite rule matches the current simulation context for the selected graphic object is performed by comparing graphic object types and graphic object properties of the before portion of the selected graphical rewrite rule to graphic object types and graphic object properties in the current simulation context.

16. A computer implemented method for executing a simulation having a plurality of graphic objects in an extensible simulation system, the method comprising the steps of:

determining a current simulation context comprising a graphical portion of a display generated upon a display device;

selecting a graphic object within the current simulation context;

determining whether there is a graphical rewrite rule having a before portion and an after portion associated with the selected graphic object, wherein the graphical rewrite rule defines a manner in which a first simulation context, matching the before portion, is to be graphically replaced with a second simulation context, matching the after portion;

selecting a graphical rewrite rule if there is a graphical rewrite rule associated with the selected graphic object;

determining whether the before portion of the selected graphical rewrite rule matches the current simulation context for the selected graphic object; and executing a program corresponding to the selected graphical rewrite rule if the before portion of the selected graphical rewrite rule matches the current simulation context, wherein the step of determining whether the before portion of the selected graphical rewrite rule matches the current simulation context for the selected graphic object further comprises the steps of:

comparing the relative positions of graphic objects in the before portion with the relative positions of graphic objects in the current simulation context;

comparing the number, relative position and graphic object occupancy of simulation grid elements in the before portion to the number, relative position and graphic object occupancy of simulation grid elements in the current simulation context wherein a simulation grid element comprises a displayable portion of the simulation;

comparing graphic object types according to a set of hierarchical classifications of the before portion to graphic object types of the current simulation context; and determining whether the property conditions defined for the graphic objects in the before portion are satisfied.

17. A computer implemented method for creating a graphical rewrite rule for a graphic object in an extensible simulation system, the method for creating a graphical rewrite rule comprising the steps of:

selecting the graphic object for which an action is to be defined in response to a selection from an input device;

determining a simulation context for the selected graphic object, wherein the simulation context is a subset of simulation grid elements containing the selected graphic object and wherein a simulation grid element comprises a displayable portion of the simulation;

displaying the simulation context in a graphical rewrite rule editor window; and generating the graphical rewrite rule in response to a graphical manipulation of the graphic object via the input device, wherein the graphical rewrite rule defines a manner in which a first simulation context, matching a before portion, is to be graphically replaced with a second simulation context, matching an after portion.

18. The method of claim 17, further comprising the steps of:

determining whether a user has updated the simulation context;

determining the updated simulation context for the selected graphic object; and displaying the updated simulation context in the before portion and the after portion of the graphical rewrite rule editor window.

19. The method of claim 17, wherein the step of creating a new program, further comprises the steps of:

selecting a graphic object within a defined simulation context in response to a selection from the input device;

defining an action corresponding to the selected graphic object in response to a selection from the input device;

recording the defined action and translating the defined action into a program step sequence;

creating a symbolic program step corresponding to the defined action; and storing the before portion and the after portion of the graphical rewrite rule corresponding to the program step sequences recorded.

20. The method of claim 19, wherein the step of defining an action corresponding to the selected graphic object is accomplished by selecting one from a group consisting of:

moving the selected graphic object from one simulation grid element to another within the simulation context in response to a selection from the input device;

defining a set of operations to be performed upon a graphic object property in response to a selection from the input device; and creating an animated transition that alters a portion of a graphic object's graphical representation within the simulation context in response to a selection from the input device.

21. The method of claim 17, further comprising the steps of:

determining whether the graphical rewrite rule is to be abstracted, wherein abstraction comprises the steps of analyzing the action, generalizing the action, and creating a corresponding generalized computer program step sequence; and performing abstraction on the graphical rewrite rule if it is determined that the graphical rewrite rule is to be abstracted.

22. A computer implemented method for creating a graphical rewrite rule for a graphic object in an extensible simulation system, the method for creating a graphical rewrite rule comprising the steps of:

selecting the graphic object for which an action is to be defined;

determining a simulation context for the selected graphic object, wherein the simulation context is a subset of simulation grid elements containing the selected graphic object and wherein a simulation grid element comprises a displayable portion of the simulation;

displaying the simulation context in a graphical rewrite rule editor window;

generating the graphical rewrite rule in response to a graphical manipulation of the graphic object via an input device, wherein the graphical rewrite rule defines a manner in which a first simulation context, matching a before portion, is to be graphically replaced with a second simulation context, matching an after portion;

determining whether the graphical rewrite rule is to be abstracted, wherein abstraction comprises the steps of analyzing the action, generalizing the action, and creating a corresponding generalized computer program step sequence; and performing abstraction on the graphical rewrite rule if it is determined that the graphical rewrite rule is to be abstracted, wherein the step of performing abstraction further comprises the steps of:

determining whether picture or property abstraction is to be performed;

if picture abstraction is to be performed, then
determining the graphic object the user has selected;
determining a hierarchical classification of graphic object types for the selected graphic object;
displaying a hierarchical classification of graphic object types for the selected graphic object in a hierarchy menu; and
determining the classification for the graphic object type selected and storing the selected classification as part of the graphical rewrite rule; and if property abstraction is to be performed, then
displaying a property abstraction window;
identifying a graphic object that was selected;
displaying the properties for the selected graphic object;
determining a property, a condition and an expression input; and
storing a property abstraction definition including the property, condition and expression input as part of the graphical rewrite rule.

23. A computer implemented method for editing a graphical rewrite rule for a graphic object having a type and a property in an extensible simulation system, the method for editing a graphical rewrite rule comprising the steps of:

determining whether a graphical rewrite rule has been selected for editing, wherein the graphical rewrite rule, having a before portion and an after portion, defines a manner for graphically replacing, on an output device, first simulation context, matching the before portion, with a second simulation context, matching the after portion, wherein the simulation context is a subset of simulation grid elements containing a selected graphic object, and wherein a simulation grid element comprises a displayable portion of the simulation;

identifying the graphical rewrite rule that has been selected for editing;

displaying the graphical rewrite rule showing the before portion and the after portion of the graphical rewrite rule in a graphical rewrite rule editor window;

determining whether the graphical rewrite rule is to be abstracted, wherein abstraction comprises the steps of analyzing the graphical rewrite rule, generalizing the graphical rewrite rule, and creating a corresponding generalized computer program step sequence; and performing abstraction on the graphical rewrite rule if it is determined the graphical rewrite rule is to be abstracted.

24. A computer implemented method for editing a graphical rewrite rule for a graphic object having a type and a property in an extensible simulation system, the method for editing a graphical rewrite rule comprising the steps of:

determining whether a graphical rewrite rule has been selected for editing, wherein the graphical rewrite rule, having a before portion and an after portion, defines a manner for graphically replacing, on an output device, a first simulation context, matching the before portion, with a second simulation context, matching the after portion, wherein the simulation context is a subset of simulation grid elements containing a selected graphic object, and wherein a simulation grid element comprises a displayable portion of the simulation;

identifying the graphical rewrite rule that has been selected for editing;

displaying the graphical rewrite rule showing the before portion and the after portion of the graphical rewrite rule in a graphical rewrite rule editor window;

determining whether the graphical rewrite rule is to be abstracted, wherein abstraction comprises the steps of analyzing the graphical rewrite rule, generalizing the graphical rewrite rule, and creating a corresponding generalized computer program step sequence; and performing abstraction on the graphical rewrite rule if it is determined the graphical rewrite rule is to be abstracted, wherein the step of performing abstraction further comprises the steps of:

determining the kind of abstraction to be performed;

if picture abstraction has been selected, then determining the graphic object a user has selected;

determining a hierarchical classification of graphic object types for the selected graphic object;

displaying a hierarchical classification of graphic object types for the selected graphic object in a hierarchy menu; and determining the classification for the graphic object type selected and storing the classification as part of the graphical rewrite rule; and if property abstraction has been selected, then displaying a property abstraction window;

identifying a graphic object that was selected;

displaying the properties for the selected graphic object;

determining a property, a condition and an expression input; and storing a property abstraction definition including the property, condition and expression input as part of the graphical rewrite rule.

25. A computerized extensible simulation system providing an easy to use and interactive environment for creating and executing a computer simulation, said system comprising:

a graphic object source means for storing a plurality of simulation graphic objects, each simulation graphic object having an associated graphical representation, a type, a unique name, a set of properties and a set of graphical rewrite rules, the graphic object source means controlling the display of a graphic object source menu for creating graphic objects and including the graphic objects in the simulation;

a simulation viewing means for viewing the simulation, the simulation viewing means controlling a display of a simulation viewer window having simulation grid elements and graphic objects displayed within the simulation viewer window;

a graphical rewrite rule editing means for creating and modifying a graphical rewrite rule and properties for graphic objects in response to a graphical manipulation of a graphic object upon the simulation viewer window via an input device wherein the graphical rewrite rule comprises program instructions defining a manner in which the graphic object is to be selectively manipulated upon the simulation viewer window;

wherein the graphical rewrite rule editing means controls the display of a graphical rewrite rule editor window having a before portion window and an after portion window, and the graphical rewrite rule editing means modifying the after portion window for actions input by a user;

an action recording means for generating a computer program step sequence for each action the user demonstrates for a graphical rewrite rule using the graphical rewrite rule editing means; and a simulation execution means for maintaining and modifying the simulation context by testing the graphical rewrite rules of each graphic object in the simulation for a match with the simulation context and performing the computer program step sequence associated with a graphical rewrite rule if the simulation context matches the before portion of the graphical rewrite rule.

26. The extensible simulation system of claim 25, wherein the simulation viewing means also generates a time-out region and a remove icon as part of the simulation viewer window, the time-out region forming an area in which a graphic object may be positioned to remove the graphic object from the simulation while retaining the rules and properties associated with the graphic object, and the remove icon enabling the selected graphic object to be deleted from the simulation viewer window.

27. The extensible simulation system of claim 25, further comprising a drawing editor means for modifying the graphical representation associated with a graphic object, for creating an animated transition corresponding to a graphic object action, and for producing a drawing editor window.

28. The extensible simulation system of claim 25, further comprising a graphic object property editing means for creating or modifying a property associated with a graphic object, for controlling the display of graphic object properties, and for generating a graphic object property editor window.

29. The extensible simulation system of claim 25, further comprising a graphic object rule viewing means for displaying the before portion and the after portion of each graphical rewrite rule in a graphic object rule viewer window.

30. The extensible simulation system of claim 25, further comprising a subroutine editing means for graphically combining graphical rewrite rules to form a subroutine, and for generating a subroutine editor window.

31. The extensible simulation system of claim 25, wherein:

the action recording means produces a symbolic program step for each action recorded; and the graphical rewrite rule editing means controls the display of a set of symbolic program steps corresponding to the graphical rewrite rule.

32. The extensible simulation system of claim 25, further comprising an abstraction means for generating a type hierarchy menu for modifying a hierarchical classification of a graphic object, and for generating a property abstraction window for creating a set of property conditions for a graphical rewrite rule.

33. The extensible simulation system of claim 32, wherein the simulation execution means tests the set of property conditions and uses the hierarchical classification of a graphic object when testing the graphical rewrite rules of each graphic object in the simulation for a match with the simulation context.

34. The extensible simulation system of claim 25, further comprising a means for generating a graphic object property display, the graphic object property display showing the properties associated with a graphic object shown in the simulation viewer window.

35. The extensible simulation system of claim 25, wherein the simulation execution means generates an execution control menu having a simulation clock window, a stop button, a single step forward button, a repeated step forward button, a single step reverse button, and a repeated step reverse button for controlling the execution of simulation.

36. The extensible simulation system of claim 25, wherein the graphical rewrite rule editing means maintains a simulation context indicator and cooperates with the simulation viewing means to show the simulation context indicator in the simulation viewer window; and wherein the simulation context indicator is an outlined box surrounding one or more of the grid elements.

37. A computer useable medium having computer readable program code embodied therein, the program code causing a computer to execute a simulation having a plurality of graphic objects in an extensible simulation system by performing steps comprising:

determining a current simulation context comprising a graphical portion of a display generated upon a display device;

selecting a graphic object within the current simulation context;

determining whether there is a graphical rewrite rule having a before portion and an after portion associated with the selected graphic object, wherein the graphical rewrite rule defines a manner in which a first simulation context, matching the before portion, is to be graphically replaced with a second simulation context, matching the after portion;

selecting a graphical rewrite rule if there is a graphical rewrite rule associated with the selected graphic object;

determining whether the before portion of the selected graphical rewrite rule matches the current simulation context for the selected graphic object; and executing a program corresponding to the selected graphical rewrite rule if the before portion of the selected graphical rewrite rule matches the current simulation context.

38. The computer useable medium of claim 37 wherein the program code for performing the step of determining whether the before portion of the selected graphical rewrite rule matches the current simulation context for the selected graphic object further comprises program code for comparing graphic object types and graphic object properties of the before portion of the selected graphical rewrite rule to graphic object types and properties in the current simulation context.

39. The computer useable medium of claim 37 wherein the program code for performing the step of determining whether the before portion of the selected graphical rewrite rule matches the current simulation context for the selected graphic object further comprises program code for:

comparing the relative positions of graphic objects in the before portion with the relative positions of graphic objects in the current simulation context;

comparing the number, relative position and graphic object occupancy of simulation grid elements in the before portion to the number, relative position and graphic object occupancy of simulation grid elements in the current simulation context wherein a simulation grid element comprises a displayable portion of the simulation; and comparing graphic object types according to a set of hierarchical classifications of the before portion to graphic object types of the current simulation context; and determining whether the property conditions defined for the graphic objects in the before portion are satisfied.

40. A computer useable medium having computer readable program code embodied therein; the program code causing a computer to create a graphical rewrite rule for a graphic object in an extensible simulation system by performing steps comprising:

selecting the graphic object for which an action is to be defined in response to a selection from an input device;

determining a simulation context for the selected graphic object, wherein the simulation context is a subset of simulation grid elements containing the selected graphic object and wherein a simulation grid element comprises a displayable portion of the simulation;

displaying the simulation context in a graphical rewrite rule editor window; and generating the graphical rewrite rule in response to a graphical manipulation of the graphic object via the input device, wherein the graphical rewrite rule defines a manner in which a first simulation context, matching a before portion, is to be graphically replaced with a second simulation context, matching an after portion.

41. The computer useable medium of claim 40 wherein the program code for performing the step of creating a new program further comprises program code for:

selecting a graphic object within a defined simulation context in response to a selection from the input device;

defining an action corresponding to the selected graphic object in response to a selection from the input device;

recording the defined action and translating the defined action into a program step sequence;

creating a symbolic program step corresponding to the defined action; and storing the before portion and the after portion of the graphical rewrite rule corresponding to the program step sequences recorded.

42. The computer useable medium of claim 41 wherein the program code for performing the step of defining an action corresponding to the selected graphic object further comprises program code selected from a group of program code consisting of:

moving the selected graphic object from one stimulation grid element to another within the simulation context in response to a selection from the input device;

defining a set of operations to be performed upon a graphic object property in response to a selection from the input device; and creating an animated transition that alters a portion of a graphic object's graphical representation within the simulation context in response to a selection from the input device.

43. The computer useable medium of claim 40 further comprising program code for:

determining whether the graphical rewrite rule is to be abstracted, wherein abstraction comprises the steps of analyzing the action, generalizing the action, and creating a corresponding generalized computer program step sequence; and performing abstraction on the graphical rewrite rule if it is determined that the graphical rewrite rule is to be abstracted.

44. The computer useable medium of claim 43 wherein the program code for performing the step of performing abstraction further comprises program code for:

determining whether picture or property abstraction is to be performed;

if picture abstraction is to be performed, then
determining the graphic object the user has selected;
determining a hierarchical classification of graphic object types for the selected graphic object;

displaying a hierarchical classification of graphic object types for the selected graphic object in a hierarchy menu; and determining the classification for the graphic object type selected and storing the selected classification as part of the graphical rewrite rule; and if property abstraction is to be performed, then
displaying a property abstraction window;
identifying a graphic object that was selected;
displaying the properties for the selected graphic object;
determining a property, a condition and an expression input; and
storing a property abstraction definition including the property, condition and expression input as part of the graphical rewrite rule.

* * * * *